US010737356B2

United States Patent
Yamada et al.

(10) Patent No.: US 10,737,356 B2
(45) Date of Patent: *Aug. 11, 2020

(54) BONDING WIRE FOR SEMICONDUCTOR DEVICE

(71) Applicants: NIPPON MICROMETAL CORPORATION, Saitama (JP); NIPPON STEEL CHEMICAL & MATERIAL CO., LTD., Tokyo (JP)

(72) Inventors: Takashi Yamada, Saitama (JP); Daizo Oda, Saitama (JP); Teruo Haibara, Saitama (JP); Ryo Oishi, Saitama (JP); Kazuyuki Saito, Saitama (JP); Tomohiro Uno, Tokyo (JP)

(73) Assignees: NIPPON MICROMETAL CORPORATION, Saitama (JP); NIPPON STEEL CHEMICAL & MATERIAL CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/577,735

(22) PCT Filed: Jun. 14, 2016

(86) PCT No.: PCT/JP2016/067624
§ 371 (c)(1),
(2) Date: Nov. 28, 2017

(87) PCT Pub. No.: WO2016/204138
PCT Pub. Date: Dec. 22, 2016

(65) Prior Publication Data
US 2018/0130763 A1    May 10, 2018

(30) Foreign Application Priority Data

Jun. 15, 2015  (JP) .................................. 2015-120509
Jul. 22, 2015  (JP) ..................... PCT/JP2015/070861

(51) Int. Cl.
*B23K 35/00*   (2006.01)
*B23K 35/02*   (2006.01)
(Continued)

(52) U.S. Cl.
CPC ........ *B23K 35/0227* (2013.01); *B23K 35/302* (2013.01); *B23K 35/3013* (2013.01);
(Continued)

(58) Field of Classification Search
CPC ............ B23K 35/0227; B23K 35/3013; B23K 35/302; B23K 2101/40; B23K 20/004; B23K 20/005; B23K 20/007; C22C 5/04; C22C 9/04; C22C 9/06; C22C 9/00; H01L 24/48; H01L 24/43; H01L 24/45; H01L 2924/01012; H01L 2924/01057; H01L 2224/45541; H01L 2224/45178; H01L 2224/45173; H01L 2224/45169; H01L 2224/45155; H01L 2224/4512;
H01L 2224/45118; H01L 2224/45113; H01L 2224/45111; H01L 2224/45109; H01L 2224/45105; H01L 2924/01052; H01L 2924/01034; H01L 2924/01033; H01L 2924/01032; H01L 2924/0102; H01L 2924/01015; H01L 2924/01005; H01L 2224/4845; H01L 2224/85464; H01L 2224/45005; H01L 2924/0705; H01L 2224/48247; H01L 2924/0665; H01L 2924/186; H01L 2224/45; H01L 2224/78; H01L 2224/85; H01L 2224/43; H01L 2224/48463; H01L 2224/05624; H01L 2224/43125; H01L 2224/4321; H01L 2224/4382; H01L 2224/43848; H01L 2224/43986; H01L 2224/45015; H01L 2224/45147; H01L 2224/4312; H01L 2224/45572; H01L 2224/45644; H01L 2224/45664; H01L 2224/48227;
(Continued)

(56) References Cited

U.S. PATENT DOCUMENTS 5,637,274 A * 6/1997 Kitamura ................ H01L 24/43
228/904
7,952,028 B2   5/2011 Uno et al.
(Continued)

FOREIGN PATENT DOCUMENTS

CN       1575512 A    2/2005
CN     101828255 A    9/2010
(Continued)

OTHER PUBLICATIONS

Decision to Grant Patent issued in Japanese Application No. 2015-552702 dated Mar. 1, 2016 (with English translation).
(Continued)

*Primary Examiner* — Kiley S Stoner
(74) *Attorney, Agent, or Firm* — McDermott Will & Emery LLP

(57) ABSTRACT

A bonding wire for a semiconductor device, characterized in that the bonding wire includes a Cu alloy core material and a Pd coating layer formed on a surface of the Cu alloy core material, the bonding wire contains an element that provides bonding reliability in a high-temperature environment, and a strength ratio defined by the following Equation (1) is 1.1 to 1.6:

$$\text{Strength ratio} = \text{ultimate strength}/0.2\% \text{ offset yield strength.} \qquad (1)$$

9 Claims, No Drawings

(51) Int. Cl.
  B32B 15/01    (2006.01)
  B32B 15/00    (2006.01)
  C23C 30/00    (2006.01)
  C22C 9/00     (2006.01)
  B23K 35/30    (2006.01)
  C22C 9/04     (2006.01)
  C22C 9/06     (2006.01)
  H01L 23/00    (2006.01)
  C22C 5/04     (2006.01)
  B23K 101/40   (2006.01)

(52) U.S. Cl.
  CPC .............. *B32B 15/00* (2013.01); *B32B 15/01* (2013.01); *B32B 15/018* (2013.01); *C22C 5/04* (2013.01); *C22C 9/00* (2013.01); *C22C 9/04* (2013.01); *C22C 9/06* (2013.01); *C23C 30/00* (2013.01); *C23C 30/005* (2013.01); *H01L 24/43* (2013.01); *H01L 24/45* (2013.01); *H01L 24/48* (2013.01); *B23K 2101/40* (2018.08); *H01L 24/05* (2013.01); *H01L 2224/05624* (2013.01); *H01L 2224/43* (2013.01); *H01L 2224/4312* (2013.01); *H01L 2224/4321* (2013.01); *H01L 2224/4382* (2013.01); *H01L 2224/43125* (2013.01); *H01L 2224/43848* (2013.01); *H01L 2224/43986* (2013.01); *H01L 2224/45* (2013.01); *H01L 2224/45005* (2013.01); *H01L 2224/4512* (2013.01); *H01L 2224/45015* (2013.01); *H01L 2224/45105* (2013.01); *H01L 2224/45109* (2013.01); *H01L 2224/45111* (2013.01); *H01L 2224/45113* (2013.01); *H01L 2224/45118* (2013.01); *H01L 2224/45147* (2013.01); *H01L 2224/45155* (2013.01); *H01L 2224/45169* (2013.01); *H01L 2224/45173* (2013.01); *H01L 2224/45178* (2013.01); *H01L 2224/45541* (2013.01); *H01L 2224/45565* (2013.01); *H01L 2224/45572* (2013.01); *H01L 2224/45644* (2013.01); *H01L 2224/45664* (2013.01); *H01L 2224/4845* (2013.01); *H01L 2224/48227* (2013.01); *H01L 2224/48247* (2013.01); *H01L 2224/48463* (2013.01); *H01L 2224/48824* (2013.01); *H01L 2224/78* (2013.01); *H01L 2224/78251* (2013.01); *H01L 2224/85* (2013.01); *H01L 2224/85065* (2013.01); *H01L 2224/85075* (2013.01); *H01L 2224/85203* (2013.01); *H01L 2224/85444* (2013.01); *H01L 2224/85464* (2013.01); *H01L 2924/0102* (2013.01); *H01L 2924/01005* (2013.01); *H01L 2924/01012* (2013.01); *H01L 2924/01015* (2013.01); *H01L 2924/01032* (2013.01); *H01L 2924/01033* (2013.01); *H01L 2924/01034* (2013.01); *H01L 2924/01052* (2013.01); *H01L 2924/01057* (2013.01); *H01L 2924/0665* (2013.01); *H01L 2924/0705* (2013.01); *H01L 2924/10253* (2013.01); *H01L 2924/186* (2013.01); *Y10T 428/1291* (2015.01); *Y10T 428/12868* (2015.01); *Y10T 428/12875* (2015.01); *Y10T 428/12882* (2015.01); *Y10T 428/12889* (2015.01); *Y10T 428/12896* (2015.01); *Y10T 428/12903* (2015.01); *Y10T 428/2495* (2015.01); *Y10T 428/24967* (2015.01); *Y10T 428/265* (2015.01)

(58) Field of Classification Search
  CPC . H01L 2224/48824; H01L 2224/78251; H01L 2224/85065; H01L 2224/85075; H01L 2224/85203; H01L 2224/85444; H01L 2924/10253; H01L 24/05; H01L 2224/45565; H01L 24/85
  USPC .............. 228/4.5, 180.5, 245–255, 56.3, 904
  See application file for complete search history.

(56) References Cited

U.S. PATENT DOCUMENTS

| | | | |
|---|---|---|---|
| 8,389,860 B2 | 3/2013 | Uno et al. | |
| 8,653,668 B2 | 2/2014 | Uno et al. | |
| 8,742,258 B2 | 6/2014 | Terashima et al. | |
| 9,230,892 B2 | 1/2016 | Itoh | |
| 9,773,748 B2 | 9/2017 | Yamada et al. | |
| 9,887,172 B2 | 2/2018 | Oda et al. | |
| 10,137,534 B2 | 11/2018 | Yamada et al. | |
| 2004/0014266 A1 | 1/2004 | Uno et al. | |
| 2006/0186544 A1 | 8/2006 | Won et al. | |
| 2008/0061440 A1* | 3/2008 | Uno | B23K 35/302 257/762 |
| 2009/0072399 A1* | 3/2009 | Terashima | H01L 24/43 257/741 |
| 2009/0127317 A1 | 5/2009 | Siepe et al. | |
| 2009/0188696 A1* | 7/2009 | Uno | B23K 20/004 174/126.2 |
| 2010/0282495 A1 | 11/2010 | Uno et al. | |
| 2010/0294532 A1 | 11/2010 | Uno et al. | |
| 2011/0011619 A1 | 1/2011 | Uno et al. | |
| 2011/0120594 A1* | 5/2011 | Uno | B32B 15/018 148/23 |
| 2012/0094121 A1 | 4/2012 | Uno et al. | |
| 2012/0118610 A1* | 5/2012 | Terashima | C22C 5/02 174/126.2 |
| 2012/0292774 A1 | 11/2012 | Itoh | |
| 2012/0299182 A1* | 11/2012 | Uno | H01L 24/48 257/738 |
| 2013/0140068 A1 | 6/2013 | Sarangapani et al. | |
| 2013/0142568 A1 | 6/2013 | Sarangapani et al. | |
| 2013/0180757 A1 | 7/2013 | Uno et al. | |
| 2014/0000932 A1 | 1/2014 | Aoyama et al. | |
| 2014/0063762 A1 | 3/2014 | Ryu et al. | |
| 2014/0209215 A1 | 7/2014 | Chuang et al. | |
| 2014/0261925 A1 | 9/2014 | Wetzel et al. | |
| 2015/0028465 A1 | 1/2015 | Itoh | |
| 2015/0360316 A1 | 12/2015 | Milke et al. | |
| 2016/0126208 A1* | 5/2016 | Lee | H01L 24/45 257/762 |
| 2017/0040281 A1 | 2/2017 | Oyamada et al. | |
| 2017/0057020 A1* | 3/2017 | Amano | C22C 9/00 |
| 2017/0125135 A1* | 5/2017 | Amano | H01B 1/026 |
| 2017/0194280 A1* | 7/2017 | Oda | H01L 24/43 |
| 2017/0200689 A1 | 7/2017 | Yamada et al. | |
| 2017/0216974 A1 | 8/2017 | Yamada et al. | |
| 2018/0133843 A1 | 5/2018 | Yamada et al. | |

FOREIGN PATENT DOCUMENTS

| | | |
|---|---|---|
| CN | 102130067 A | 7/2011 |
| CN | 102422404 A | 4/2012 |
| CN | 102459668 A | 5/2012 |
| CN | 102687259 A | 9/2012 |
| CN | 102776408 A | 11/2012 |
| CN | 103137235 A | 6/2013 |
| CN | 103608474 A | 2/2014 |
| CN | 104051080 A | 9/2014 |
| CN | 104157625 A | 11/2014 |
| CN | 104241237 A | 12/2014 |
| CN | 104593635 A | 5/2015 |
| CN | 105518165 A | 4/2016 |
| EP | 1447842 A1 | 8/2004 |
| EP | 1 677 345 A1 | 7/2006 |
| EP | 2447380 A1 | 5/2012 |
| EP | 2461358 A1 | 6/2012 |
| EP | 2768019 A2 | 8/2014 |
| EP | 3 042 972 A1 | 7/2016 |
| JP | S61-20693 | 1/1986 |

(56) References Cited

FOREIGN PATENT DOCUMENTS

| | | | |
|---|---|---|---|
| JP | S61-48543 A | 3/1986 | |
| JP | S61-163194 A | 7/1986 | |
| JP | S61-234063 A | 10/1986 | |
| JP | 62-97360 A | 5/1987 | |
| JP | S62-130248 A | 6/1987 | |
| JP | S62-130249 A | 6/1987 | |
| JP | S63-238232 A | 10/1988 | |
| JP | H01-290231 A | 11/1989 | |
| JP | H02-170937 A | 7/1990 | |
| JP | H07-086325 A | 3/1995 | |
| JP | H07-138678 A | 5/1995 | |
| JP | 2005-167020 A | 6/2005 | |
| JP | 2006-100777 A | 4/2006 | |
| JP | 2006-190763 A | 7/2006 | |
| JP | 2006-216929 A | 8/2006 | |
| JP | 2007-012776 A | 1/2007 | |
| JP | 2007-019349 A | * | 1/2007 |
| JP | 2009-140942 A | 6/2009 | |
| JP | 2009-140953 A | 6/2009 | |
| JP | 2011-035020 A | 2/2011 | |
| JP | 2011-077254 A | 4/2011 | |
| JP | 2011-159894 A | 8/2011 | |
| JP | 2012-036490 A | 2/2012 | |
| JP | 2012-089685 A | 5/2012 | |
| JP | 2013-131654 A | 7/2013 | |
| JP | 2013-232693 A | 11/2013 | |
| JP | 2014-070252 A | 4/2014 | |
| JP | 2014-075458 A | 4/2014 | |
| JP | 2014-165272 A | 9/2014 | |
| JP | 2014-179412 A | 9/2014 | |
| JP | WO2013/140745 A1 | 8/2015 | |
| JP | 5912008 B1 | 4/2016 | |
| JP | 2016-517623 A | 6/2016 | |
| KR | 10-1997-0068996 A | 11/1997 | |
| KR | 10-2004-0073667 A | 8/2004 | |
| KR | 10-2010-0023893 A | 3/2010 | |
| KR | 10-2012-0035093 A | 4/2012 | |
| KR | 10-2012-0046019 A | 5/2012 | |
| KR | 10-1332890 B1 | 11/2013 | |
| KR | 101366688 B1 | 2/2014 | |
| KR | 10-2014-0103767 | 8/2014 | |
| KR | 10-2015-0030554 A | 3/2015 | |
| SG | 191711 A1 | 8/2013 | |
| TW | 200304209 A | 9/2003 | |
| TW | 200944319 A | 11/2009 | |
| TW | 201010819 A | 3/2010 | |
| TW | 201205695 A | 2/2012 | |
| TW | M442579 U | 12/2012 | |
| TW | 201306985 A | 2/2013 | |
| TW | 201315821 A | 4/2013 | |
| TW | M454881 U | 6/2013 | |
| TW | M466108 U | 11/2013 | |
| TW | 201448152 A | 12/2014 | |
| TW | 201521128 A | 6/2015 | |
| WO | 2009/072525 A1 | 6/2009 | |
| WO | 2009/093554 A1 | 7/2009 | |
| WO | 2011/013527 A1 | 2/2011 | |
| WO | 2011/093038 A1 | 8/2011 | |
| WO | 2011/129256 A1 | 10/2011 | |
| WO | 2014/141975 A1 | 9/2014 | |
| WO | 2015/034071 A1 | 3/2015 | |
| WO | 2015/115241 A1 | 8/2015 | |
| WO | 2015/163297 A1 | 10/2015 | |

OTHER PUBLICATIONS

International Search Report and Written Opinion issued in International Application No. PCT/JP2015/070861 dated Oct. 13, 2015 (with English translation).
Extended European Search Report dated Feb. 16, 2017, issued in European Application No. 15866375.7.
Office Action issued in corresponding Japanese Patent Application No. 2016-151318, dated Jul. 25, 2017 with English Translation.
Notice of Allowance issued in corresponding Korean Patent Application No. 10-2017-7005522, dated Jul. 6, 2017 with English Translation.
Decision to Grant Patent Japanese Patent Application No. 2016-533746 dated Jul. 19, 2016 with English translation.
Decision to Grant Korean Patent Application No. 10-2016-7010922 dated Aug. 30, 2016 with full English translation.
Notification of Reasons for Refusal issued Taiwan Patent Application No. 104124133 dated Jun. 3, 2016.
Notification of Reason(s) for Refusal issued in Japanese Application No. 2015-552702 dated Jan. 26, 2016 (with English translation).
Office Action issued in U.S. Appl. No. 15/107,421 dated Jun. 12, 2017.
International Search Report issued in International Application No. PCT/JP2016/064926 dated Jul. 26, 2016 (with English translation).
Decision to Grant issued in corresponding Japanese Patent Application No. 2016-151318, dated Oct. 31, 2017.
Office Action issued in corresponding Chinese Patent Application No. 201580002424.4, dated Apr. 4, 2018.
Final Office Action issued in related U.S. Appl. No. 15/107,421, dated Nov. 7, 2017.
Korean Office Action issued in corresponding Korean Patent Application No. 10-2017-7024954, dated May 6, 2018, with English Translation.
Taiwanese Decisiion to Grant issued in corresponding Taiwanese Patent Application No. 105118619, dated Jun. 4, 2018.
S.M. Baeck et al., "Texture Analysis of Copper Bonding Wire", Materials Science Forum, vols. 408-412, (2012), pp. 803-808.
Extended European Search Report issued in corresponding European Patent Application No. 18154972.6, dated Jun. 18, 2018.
Office Action issued in Chinese Application No. 201680002657.9 dated Jan. 2, 2018 (with English translation).
Notice of Allowance in Taiwanese Application No. 105137924 dated Jan. 10, 2018.
German Office Action issued in corresponding German Patent Application No. 11 2016 000 133.9, dated Jun. 19, 2018, with English Translation.
Notification of Reasons for Refusal issued in corresponding Japanese Patent Application No. 2017-525235, dated Oct. 3, 2017.
Yasuhiko Miyake, "Recent Aspects on Manufacturing Methods and Applications of Super Pure Copper for Industrial Use", Bulletin of the Japan Institute of Metals, vol. 31, No. 4, p. 267-276 (1992) (with partial English translation).
Search Report issued in corresponding International Patent Application No. PCT/JP2016/067624, dated Sep. 6, 2016.
Decision to Grant issued in related Japanese Patent Application No. 2017-5255235, dated Mar. 13, 2018.
German Office Action issued in corresponding German Patent Application No. 11 2015 004 422.1, dated May 15, 2018, with English Translation.
Chinese Office Action issued in corresponding Chinese Patent Application No. 201680027572.6, dated Nov. 21, 2018, with English Translation.
Chinese Office Action issued in corresponding Chinese Patent Application No. 201680002657.9, dated Jan. 3, 2019 of related U.S. Appl. No. 15/515,508, with English Translation.
U.S. Non-Final Office Action issued in related U.S. Appl. No. 15/851,554, dated Dec. 20, 2018.
Taiwanese Notice of Allowance issued in corresponding Taiwanese Patent Application No. 105140437, dated Aug. 6, 2018.
Chinese Office Action issued in corresponding Chinese Patent Application No. 201680027572.6, dated Nov. 21, 2018.
International Search Report issued in International Application No. PCT/JP2015/071002, dated Oct. 20, 2015, with English Translation.
Notification of Reasons for Refusal Japanese Patent Application No. 2015-540380, dated Nov. 10, 2015, with English translation.
Decision to Grant a Patent Japanese Patent Application No. 2015-540380, dated Feb. 16, 2016, with English translation.
Decision to Grant a Patent issued in corresponding Taiwanese Patent Application No. 104124132, dated Jul. 28, 2016.
Partial European Search Report dated Jan. 10, 2017, issued in European Application No. 15882901.0.

(56) References Cited

OTHER PUBLICATIONS

Taiwanese Notice of Allowance dated Nov. 30, 2016, issued in Taiwanese Application No. 105101101.
Notification of Reason(s) for Refusal dated Apr. 12, 2016, issued in Japanese Patent Application No. 2016-507915, with English translation.
Decision to Grant a Patent dated Jun. 7, 2016, issued in Japanese Patent Application No. 2016-507915. (w/ English translation).
International Search Report and Written Opinion dated Mar. 22, 2016, issued in International Application No. PCT/JP2015/086550, with English Translation.
Partial European Search Report dated Jan. 10, 2017, issued in European Application No. 15866376.5.
Korean Notice of Allowance dated Apr. 20, 2017, issued in Korean Patent Application No. 10-2016-7019958, with English translation.
Extended European Search Report dated May 15, 2017, issued in European Application No. 15882901.0.
Extended European Search Report issued in corresponding European Application No. 15866376.5, dated Jun. 27, 2017.
Ablitzer and Combeau, Phenomenes De Transport. Deuxieme Partie ED, pp. 83-174, Jan. 1, 1996 (XP001525460).
First Office Action issued in Chinese Patent Application No. 201580005634.9, dated Mar. 2, 2018, with English translation.
Office Action issued in European Patent Application No. 15866376.5, dated Apr. 9, 2018.
Office Action issued in Chinese Patent Application No. 201580002602.3, dated Mar. 21, 2018.
International Search Report issued in International Application No. PCT/JP2015/062040 dated Jul. 21, 2015, with English Translation.
Notice of Allowance issued in U.S. Appl. No. 15/515,508, dated Feb. 14, 2019.
Korean Notice of Allowance dated Aug. 30, 2016, issued in Korean Patent Application No. 10-2016-7010922.
Japanese Decision to Grant a Patent issued in corresponding Japanese Patent Application No. 2017-525235, dated Mar. 5, 2018, with English Translation.
Annex to the Summons to Attend Oral Proceedings in the German Patent and Trademark Office issued in German Patent Application No. 11 2015 004 422.1, dated Mar. 1, 2019, with English Translation.
Bargel et al., Extract from the 10th Edition of Werkstoffkunde, Springer-Verlag Berlin Heidelberg, pp. 100-103 (2008), discussed in the German Office Action dated Feb. 18, 2019, with English Translation.
Notification of Reasons for Refusal issued in Japanese Application No. 2016-151318 dated Jul. 25, 2017, with English translation.
German Office Action issued in German Patent Application No. 11 2016-002 703.6, dated Feb. 18, 2019, with English translation.
Office Action issued in Taiwanese Patent Application No. 10520697230 dated Jun. 3, 2016.
Notice of Allowance issued in related U.S. Appl. No. 15/107,427, dated Apr. 10, 2019.
Notice of Allowance issued in related U.S. Appl. No. 15/107,427, dated Dec. 19, 2018.
Notice of Allowance issued in related U.S. Appl. No. 15/107,427, dated Apr. 26, 2019.
Notice of Allowance issued in related U.S. Appl. No. 15/107,421, dated Sep. 20, 2018.
Non-Final Office Action issued in related U.S. Appl. No. 15/107,427, dated Sep. 4, 2018.
Non-Final Office Action issued in related U.S. Appl. No. 15/107,427, dated Aug. 3, 2017.
Notice of Allowance issued in related U.S. Appl. No. 15/107,421, dated Oct. 15, 2018.
Non-Final Office Action issued in related U.S. Appl. No. 15/107,421, dated Mar. 13, 2018.
Final Office Action issued in related U.S. Appl. No. 15/107,421, dated Jul. 19, 2018.
Notice of Allowance issued in related U.S. Appl. No. 15/116,145, dated Aug. 24, 2017.
Notice of Allowance issued in related U.S. Appl. No. 15/116,145, dated May 3, 2017.
Notice of Allowance issued in related U.S. Appl. No. 15/515,508, dated Nov. 2, 2018.
Non-Final Office Action issued in related U.S. Appl. No. 15/515,508, dated Jun. 27, 2018.
Non-Final Office Action issued in related U.S. Appl. No. 15/851,554, dated Jun. 27, 2018.
Final Office Action issued in related U.S. Appl. No. 15/107,427, dated Jan. 17, 2018.
Notice of Reasons for Refusal issued in corresponding Japanese Application No. 2016-065088, dated May 14, 2019, with English translation.
Taiwanese Office Action issued in corresponding Taiwanese Application No. 107104291, dated Dec. 20, 2019.
Decision to Grant a Patent issued in corresponding Japanese Patent Application No. 2017-228996, dated Jan. 21, 2020, with English translation.
Notice of Reasons for Refusal issued in corresponding Japanese Patent Application No. 2018-071290, dated Feb. 18, 2020, with English translation.

* cited by examiner

BONDING WIRE FOR SEMICONDUCTOR DEVICE

CROSS REFERENCE

This application is the U.S. National Phase under 35 U.S.C. § 371 of International Application No. PCT/JP2016/067624, filed on Jun. 14, 2016, which claims the benefit of Japanese Application No. 2015-120509, filed on Jun. 15, 2015 and International Patent Application No. PCT/JP2015/070861, filed on Jul. 22, 2015, the entire contents of each are hereby incorporated by reference.

TECHNICAL FIELD

The present invention relates to a bonding wire for a semiconductor device used to connect electrodes on a semiconductor device and wiring of a circuit wiring board such as outer leads.

BACKGROUND ART

Currently, as a bonding wire for a semiconductor device connecting between electrodes on a semiconductor device and outer leads (hereinafter referred to as a "bonding wire"), thin wires with a wire diameter of about 15 to 50 μm are mainly being used. A method for bonding the bonding wire is generally a thermal compressive bonding technique with the aid of ultrasound, which uses a general-purpose bonder, a capillary tool used for bonding by passing the bonding wire therethrough, and the like. A bonding process of a bonding wire is carried out by heating and melting a tip of wire by arc heat input to form a ball (FAB: free air ball) through surface tension; crimp-bonding the ball part onto an electrode of the semiconductor device heated within a range of 150 to 300° C. (hereinafter referred to as "ball bonding"); forming a loop; and finally crimp-bonding a wire part onto an electrode of the outer lead (hereinafter referred to as "wedge bonding"). As bonding counterparts of the bonding wire, an electrode structure in which an alloy mainly containing Al is formed as a film on a Si substrate is used for the electrode on the semiconductor device, whereas an electrode structure plated with Ag or Pd is used for the electrode of the outer lead.

Au, which has been mainly used as a material of the bonding wire, has been being replaced with Cu mainly for LSI use. On the background of recent proliferation of electric vehicles and hybrid vehicles, needs for replacing Au with Cu are increasing also in on-vehicle device use.

As for a Cu bonding wire, there has been proposed a wire using high-purity Cu (purity: 99.99% by mass or more) (for example, Patent Literature 1). Cu has the drawback of being more susceptible to oxidation than Au and has problems in that bonding reliability, ball formability and wedge bondability are inferior. As a method for preventing surface oxidation of a Cu bonding wire, there has been proposed a structure in which a surface of Cu core material is coated with a metal such as Au, Ag, Pt, Pd, Ni, Co, Cr and Ti (Patent Literature 2). There has been also proposed a structure in which a surface of Cu core material is coated with Pd and a surface thereof is coated with Au, Ag, Cu or an alloy thereof (Patent Literature 3).

RELATED ART REFERENCE

Patent Literature

Patent Literature 1: JP-A-S61-48543
Patent Literature 2: JP-A-2005-167020
Patent Literature 3: JP-A-2012-36490

SUMMARY OF INVENTION

Problem to be Solved by the Invention

On-vehicle devices require bonding reliability in a more rigorous high-temperature and high-humidity environment than general electronic devices. In particular, the bonding longevity of a ball bonded part in which the ball part of the wire is bonded to the electrode is the biggest concern.

A representative evaluation method for evaluating the bonding reliability of a ball bonded part in a high-temperature and high-humidity environment includes a highly accelerated temperature and humidity stress test (HAST) (a high-temperature and high-humidity environment exposure test). When the bonding reliability of a ball bonded part is evaluated by HAST, a ball bonded part to be evaluated is exposed to a high-temperature and high-humidity environment with a temperature of 130° C. and a relative humidity of 85%, and then, the bonding longevity of the ball bonded part is evaluated by measuring temporal changes in a resistance value of the bonded part or by measuring temporal changes in shear strength of the ball bonded part.

Further, as means for evaluating the bonding reliability of the ball bonded part in a high-temperature environment at 170° C. or more, a high temperature storage test (HTS) is used. When the bonding reliability of a ball bonded part is evaluated by HTS, a sample to be evaluated is exposed to a high-temperature environment, and then, the bonding longevity of the ball bonded part is evaluated by measuring temporal changes in a resistance value of the bonded part or measuring temporal changes in shear strength of the ball bonded part.

As a result of investigation by the present inventors, it has been revealed that the bonding wire containing an element that provides bonding reliability in a high-temperature environment such as, for example, Ni, Zn, Rh, In, Ir and Pt exhibits an improved bonding reliability of the ball bonded part in a high-temperature environment of 130° C. or more, compared to the wire not containing such element.

On the other hand, the bonding wire is extremely deformed in the wedge bonding. If the wire is subjected to work hardening in the deformation, the wire after bonding hardens, resulting in a decrease in the bonding strength of the wedge bonding. In cases where the above element is contained into the bonding wire, the wire is subjected to work hardening depending on the amount of the above element when the bonding wire is extremely deformed in the wedge bonding. Hence, in some cases, the wire after bonding hardens and as a result the bonding strength of the wedge bonding decreases.

An object of the present invention is to provide a bonding wire for a semiconductor device including a Cu alloy core material and a Pd coating layer formed on a surface thereof, the bonding wire for a semiconductor device being capable of improving both of the bonding reliability of the ball bonded part in high temperature and the wedge bondability.

Means for Solving Problem

As a result of intensive study to solve the problem described above, it has been found that both of the bonding reliability of the ball bonded part in high temperature and the wedge bondability can be improved by containing an element that provides bonding reliability in a high-temperature environment into the bonding wire as well as by making the strength ratio defined by Equation (1) being 1.1 to 1.6. The present invention is based on such new findings.

$$\text{Strength ratio=ultimate strength/0.2\% offset yield strength.} \quad (1)$$

That is, the summary of the present invention is as follows.

[1] A bonding wire for a semiconductor device, the bonding wire comprising: a Cu alloy core material; and a Pd coating layer formed on a surface of the Cu alloy core material, wherein the bonding wire contains an element that provides bonding reliability in a high-temperature environment, and a strength ratio defined by the following Equation (1) is 1.1 to 1.6:

$$\text{Strength ratio=ultimate strength/0.2\% offset yield strength.} \quad (1)$$

[2] The bonding wire for a semiconductor device according to [1], wherein a thickness of the Pd coating layer is 0.015 to 0.150 µm.

[3] The bonding wire for a semiconductor device according to [1] or [2], further comprising an alloy skin layer containing Au and Pd on the Pd coating layer.

[4] The bonding wire for a semiconductor device according to [3], wherein a thickness of the alloy skin layer containing Au and Pd is 0.050 µm or less.

[5] The bonding wire for a semiconductor device according to any one of [1] to [4], wherein the bonding wire contains at least one element selected from Ni, Zn, Rh, In, Ir and Pt, and a concentration of the at least one element in total is 0.011 to 2% by mass relative to the entire wire.

[6] The bonding wire for a semiconductor device according to any one of [1] to [5], wherein the bonding wire contains one or more elements selected from Ga and Ge, and a concentration of the elements in total is 0.011 to 1.5% by mass relative to the entire wire.

[7] The bonding wire for a semiconductor device according to any one of [1] to [6], wherein the bonding wire contains at least one or more elements selected from As, Te, Sn, Sb, Bi and Se, a concentration of the elements in total is 0.1 to 100 ppm by mass relative to the entire wire, and Sn≤10 ppm by mass; Sb≤10 ppm by mass; and Bi≤1 ppm by mass.

[8] The bonding wire for a semiconductor device according to any one of [1] to [7], wherein the bonding wire further contains at least one element selected from B, P, Mg, Ca and La, and a concentration of each of the at least one element is 1 to 200 ppm by mass relative to the entire wire.

[9] The bonding wire for a semiconductor device according to any one of [1] to [8], wherein Cu is present at an outermost surface of the bonding wire.

Effect of the Invention

The present invention can provide a bonding wire for a semiconductor device including a Cu alloy core material and a Pd coating layer formed on a surface of the Cu alloy core material which is capable of improving both of the bonding reliability of the ball bonded part in a high-temperature environment and the wedge bondability.

EMBODIMENT FOR CARRYING OUT THE INVENTION

The bonding wire for a semiconductor device of the present invention includes a Cu alloy core material and a Pd coating layer formed on a surface of the Cu alloy core material. In the present invention, the bonding wire contains an element that provides bonding reliability in a high-temperature environment and a strength ratio defined by the following Equation (1) is 1.1 to 1.6:

$$\text{Strength ratio=ultimate strength/0.2\% offset yield strength.} \quad (1)$$

A mold resin (an epoxy resin) as a package of a semiconductor device contains chlorine (Cl) in its molecular skeleton. In a high-temperature and high-humidity environment of a temperature of 130° C. and a relative humidity of 85% as a HAST evaluation condition, Cl in the molecular skeleton hydrolyzes and dissolves as a chloride ion (Cl$^-$). In a case where a Cu bonding wire having no Pd coating layer is bonded to an Al electrode, when a Cu/Al bonding interface is placed in high temperature, Cu and Al mutually diffuse, and $Cu_9Al_4$ as an intermetallic compound is finally formed. $Cu_9Al_4$ is susceptible to corrosion by halogen and undergoes corrosion by Cl dissolved from the mold resin, leading to degradation in the bonding reliability. In a case where a Cu wire has a Pd coating layer, a bonding interface between the Pd-coated Cu wire and the Al electrode has a structure of Cu/Pd-concentrated layer/Al, whereby a formation of the $Cu_9Al_4$ intermetallic compound is reduced compared with a case of the Cu wire having no Pd coating layer, but it is still insufficient in a bonding reliability in a high-temperature and high-humidity environment required for on-vehicle devices.

In contrast, it is considered that when containing an element that provides bonding reliability in a high-temperature environment as in the present invention, a formation of a $Cu_9Al_4$ intermetallic compound in the bonded part tends to be further reduced.

In view of improving the bonding reliability of the ball bonded part in a high-temperature environment (especially the performance in HTS at 175° C. or more), the concentration of the element that provides bonding reliability in a high-temperature environment in total relative to the entire wire is preferably 0.011% by mass or more, more preferably 0.030% by mass or more, further preferably 0.050% by mass or more, 0.070% by mass or more, 0.090% by mass or more, 0.10% by mass or more, 0.15% by mass or more, or 0.20% by mass or more. The element that provides bonding reliability in a high-temperature environment will be described in detail below.

As described above, the bonding wire is extremely deformed in the wedge bonding. If the wire is subjected to work hardening in the deformation, the wire after bonding hardens, resulting in a decrease in the bonding strength of the wedge bonding. In order to maintain favorable wedge bonding strength, the strength ratio defined by the following Equation (1) is preferably 1.6 or less, more preferably 1.55 or less, and further preferably 1.50 or less, 1.45 or less, or 1.40 or less. In view of achieving favorable wedge bondability, the strength ratio is preferably 1.1 or more.

$$\text{Strength ratio=ultimate strength/0.2\% offset yield strength.} \quad (1)$$

Examples of means for maintaining the strength ratio of Equation (1) at the preferable range may include controlling (i) an orientation proportion of a crystal orientation <100> angled at 15 degrees or less to a wire longitudinal direction among crystal orientations in the wire longitudinal direction when measuring crystal orientations on a cross-section of the core material in a direction perpendicular to a wire axis of the bonding wire (hereinafter, may also be referred to as a "<100> orientation proportion") and (ii) an average crystal grain size in the cross-section of the core material in the direction perpendicular to the wire axis of the bonding wire (hereinafter, may also be referred to as an "average crystal grain size"). It has been revealed that when the bonding wire is manufactured by a normal method of manufacture, the strength ratio becomes less than 1.1 or becomes more than 1.6. In contrast, it has been revealed that by devising a method of manufacture as described below, the orientation proportion of <100> containing angled at 15 degrees or less to a wire longitudinal direction among crystal orientations in the wire longitudinal direction on a cross-section of the core material in the direction perpendicular to the wire axis of the bonding wire can be 30% or more, and the average crystal grain size in the cross-section of the core material in the direction perpendicular to the wire axis of the bonding wire can be 0.9 to 1.5 µm, as a result of which the strength ratio of Equation (1) can be 1.1 to 1.6.

If the <100> orientation proportion is 30% or more, work hardening of the wire along with the deformation at the time of the wedge bonding is small, whereby the strength ratio can be 1.6 or less. However, even in this case, if the average crystal grain size is less than 0.9 µm, the 0.2% offset yield strength is high (poor in ductility), whereby the strength ratio is less than 1.1, which is inferior in the wedge bondability. If the average crystal grain size is more than 1.5 µm, it is estimated that the <100> orientation proportion is less than 30%, and in addition, the 0.2% offset yield strength is low, whereby the strength ratio is more than 1.6, and the wedge bondability is inferior.

In view of decreasing work hardening of wire associated with deformation during wedge bonding, the <100> orientation proportion is preferably 30% or more, more preferably 35% or more, further preferably 40% or more, or 45% or more. Although the upper limit of the <100> orientation proportion is not specifically limited, it may be, for example, 90% or less, 80% or less, 70% or less, 60% or less, 50% or less, or less than 50% (e.g. 49% or less).

In view of suppressing the increase of the strength ratio, an average crystal grain size in the cross-section of the core material in the direction perpendicular to the wire axis of the bonding wire is preferably 0.9 µm or more and 1.5 µm or less. The lower limit of the average crystal grain size in the cross-section of the core material in the direction perpendicular to the wire axis of the bonding wire can be 1.0 µm or more, 1.1 µm or more, 1.3 µm or more, or more than 1.3 µm (e.g. 1.35 µm or more).

Even when the crystal structure of the wire fulfills the conditions, if the content of the element that provides bonding reliability in a high-temperature environment in the wire is excessively large, the strength ratio may increase. In view of achieving the strength ratio of 1.6 or less and reducing the hardening of the bonding wire to reduce degradation of the wedge bondability, the concentration of the element that provides bonding reliability in a high-temperature environment in total relative to the entire wire is preferably 2.0% by mass or less, 1.8% by mass or less, or 1.6% by mass or less.

As for addition of the element that provides bonding reliability in a high-temperature environment into the bonding wire, the effect of the invention can be exhibited by employing either of a method of adding the element into a Cu core material or a method of depositing the element onto a Cu core material or a surface of wire to add the element therein. An added amount of these elements is infinitesimal and allows a wide variety of methods of addition, and the effect is exhibited by any method of addition so long as the element is contained.

In the bonding wire of the present invention, the thickness of the Pd coating layer is preferably 0.015 µm or more, more preferably 0.02 µm or more, and further preferably 0.025 µm or more, 0.03 µm or more, 0.035 µm or more, 0.04 µm or more, 0.045 µm or more, or 0.05 µm or more in view of obtaining favorable FAB shape and in view of further improving the bonding reliability of the ball bonded part in the high-temperature and high-humidity environment required in on-vehicle devices. An excessively large thickness of the Pd coating layer deteriorates the FAB shape, and the thickness of the Pd coating layer is preferably 0.150 µm or less and more preferably 0.140 µm or less, 0.130 µm or less, 0.120 µm or less, 0.110 µm or less, or 0.100 µm or less.

There will be described the definition of the Cu alloy core material and the Pd coating layer of the bonding wire. A boundary between the Cu alloy core material and the Pd coating layer was determined based on a concentration of Pd. The boundary was set to be a position at which a concentration of Pd was 50 at %, and a region in which a concentration of Pd was 50 at % or more was determined to be the Pd coating layer, and a region in which a concentration of Pd was less than 50 at % was determined to be the Cu alloy core material. This is because if a concentration of Pd is 50 at % or more in the Pd coating layer, there can be expected an effect of improving characteristics from the structure of the Pd coating layer. The Pd coating layer may contain a region of a Pd single layer and a region having concentration gradients of Pd and Cu in a wire depth direction. The reason why the region having the concentration gradients is formed in the Pd coating layer is that atoms of Pd and Cu may diffuse through heat treatment or the like in a manufacturing process. In the present invention, the concentration gradient refers to the fact that a degree of a change in concentration in the depth direction is 10 mol % or more per 0.1 µm. Furthermore, the Pd coating layer may contain inevitable impurities.

The bonding wire of the present invention may further include an alloy skin layer containing Au and Pd on the surface of the Pd coating layer. With this configuration, the bonding wire of the present invention can further improve the bonding reliability and can further improve the wedge bondability.

There will be described the definition of the alloy skin layer containing Au and Pd of the bonding wire. A boundary between the alloy skin layer containing Au and Pd and the Pd coating layer was determined based on a concentration of Au. The boundary was set to be a position at which a concentration of Au was 10 at %, and a region in which a concentration of Au was 10 at % or more was determined to be the alloy skin layer containing Au and Pd, and a region in which a concentration of Au was less than 10 at % was determined to be the Pd coating layer. Even in the region in which a concentration of Pd was 50 at % or more, a region in which Au was present at 10 at % or more was determined to be the alloy skin layer containing Au and Pd. These determinations are because if a concentration of Au falls within the range mentioned above, there can be expected an effect of improving characteristics from the structure of the Au skin layer. The alloy skin layer containing Au and Pd is an Au—Pd alloy and contains a region having concentration gradients of Au and Pd in the wire depth direction. The reason why the region having the concentration gradients is formed in the alloy skin layer containing Au and Pd is that atoms of Au and Pd diffuse through heat treatment or the like in the manufacturing process. Furthermore, the alloy skin layer containing Au and Pd may contain inevitable impurities and Cu.

In the bonding wire of the present invention, the alloy skin layer containing Au and Pd reacts with the Pd coating layer to improve adhesive strength among the alloy skin layer containing Au and Pd, the Pd coating layer and the Cu alloy core material and to prevent the Pd coating layer and the alloy skin layer containing Au and Pd from peeling at the time of wedge bonding. Accordingly, the bonding wire of the present invention can further improve the wedge bondability. In view of obtaining favorable wedge bondability, a thickness of the alloy skin layer containing Au and Pd is preferably 0.0005 μm or more, and more preferably 0.001 μm or more, 0.002 μm or more, or 0.003 μm or more. In view of reducing eccentricity to obtain favorable FAB shape, a thickness of the alloy skin layer containing Au and Pd is preferably 0.050 μm or less, and more preferably 0.045 μm or less, 0.040 μm or less, 0.035 μm or less, or 0.030 μm or less. The alloy skin layer containing Au and Pd can be formed by a method similar to that of the Pd coating layer.

In the present invention, examples of the element that provides bonding reliability in a high-temperature environment include an element of Group 9 of the Periodic Table of Elements (Co, Rh, Ir), an element of Group 10 of the Periodic Table of Elements (Ni, Pd, Pt), an element of Group 11 of the Periodic Table of Elements (Ag, Au and the like), an element of Group 12 of the Periodic Table of Elements (Zn and the like), an element of Group 13 of the Periodic Table of Elements (Al, Ga, In and the like), an element of Group 14 of the Periodic Table of Elements (Ge, Sn and the like), an element of Group 15 of the Periodic Table of Elements (P, As, Sb, Bi and the like), an element of Group 16 of the Periodic Table of Elements (Se, Te and the like), and the like. These elements can be contained in the bonding wire singly or in combination of two or more thereof.

In the present invention, it is preferable that the bonding wire contains at least one element selected from Ni, Zn, Rh, In, Ir and Pt as the element that provides bonding reliability in a high-temperature environment. Preferably, a concentration of these elements in total is 0.011 to 2% by mass relative to the entire wire.

A mold resin (an epoxy resin) as a package of a semiconductor device contains a silane coupling agent. The silane coupling agent has a function of improving adhesiveness between organic matter (resin) and inorganic matter (silicon or metal) and can thereby improve adhesiveness with a silicon substrate or metal. In a case where a higher adhesiveness is required such as a case of on-vehicle semiconductors that require reliability at higher temperatures, a "sulfur-containing silane coupling agent" is added therein. Sulfur contained in the mold resin is liberated when being used under a condition of 175° C. or more, e.g., 175° C. to 200° C. When sulfur liberated at a high temperature of 175° C. or more comes in contact with Cu, Cu drastically corrodes to produce a sulfide ($Cu_2S$) or an oxide (CuO). When the corrosion of Cu occurs in a semiconductor device using Cu bonding wire, a bonding reliability, especially of a ball bonded part, degrades.

The bonding reliability in a high-temperature environment (especially the performance in HTS at 175° C. or more) can be improved by employing a configuration where the bonding wire contains at least one element selected from Ni, Zn, Rh, In, Ir and Pt and a concentration of the at least one element in total is 0.011 to 2% by mass relative to the entire wire. In view of improving the bonding reliability of the ball bonded part in a high-temperature environment (especially the performance in HTS at 175° C. or more), the concentration of the element in total relative to the entire wire is preferably 0.011% by mass or more, more preferably 0.050% by mass or more, further preferably 0.070% by mass or more, 0.090% by mass or more, 0.10% by mass or more, 0.15% by mass or more, or 0.20% by mass or more. The at least one element selected from Ni, Zn, Rh, In, Ir and Pt may also be referred to as an "element $M_A$" in the following description.

In the present invention, it is preferable that the bonding wire contains one or more elements selected from Ga and Ge as the element that provides bonding reliability in a high-temperature environment and a concentration of the elements in total is 0.011 to 1.5% by mass relative to the entire wire. The wire may contain one or more elements selected from Ga and Ge instead of the element $M_A$ or in combination with the element $M_A$. The one or more elements selected from Ga and Ge may also be referred to as an "element $M_B$" in the following description.

During formation of FAB of ball bonded part, Ga and Ge in the wire diffuse also to the Pd coating layer. It is considered that Ga and Ge present in the Pd-concentrated layer of the Cu/Al interface in the ball bonded part enhance an effect of reducing a mutual diffusion of Cu and Al by the Pd concentrated layer, resulting in the reduction of the formation of $Cu_9Al_4$, which is likely to corrode in a high-temperature and high-humidity environment. In addition, Ga and Ge contained in the wire may have the effect of directly inhibiting the formation of $Cu_9Al_4$.

Furthermore, when forming a ball using a Pd-coated Cu bonding wire containing at least one selected from Ga and Ge in certain amount and observing a resultant FAB with a scanning electron microscope (SEM), many precipitates with a diameter of about a few tens of nanometers were found on a surface of the FAB. From an analysis on the precipitates by energy dispersive X-ray spectroscopy (EDS), it was revealed that Ga and/or Ge was concentrated. Although a detailed mechanism is unclear, it is considered from the above situation that these precipitates observed on the FAB become to be present at the bonding interface of the ball and the electrode, whereby significantly improving a bonding reliability of a ball bonded part in a high-temperature and high-humidity environment of a temperature of 130° C. and a relative humidity of 85%.

Although it is preferable that Ga and Ge are present in the Cu alloy core material, a sufficient effect can be obtained even when they are contained in the Pd coating layer or an alloy skin layer containing Au and Pd described below. A method of adding Ga and Ge into the Cu alloy core material is easy in terms of accurate control of concentration, and improves wire productivity and quality stability. Further, a part of Ga and Ge is contained also in the Pd coating layer or the alloy skin layer due to diffusion through a heat treatment or the like, whereby improving an adhesiveness of interfaces among the layers, and thus being able to further improve wire productivity.

In view of obtaining favorable FAB shape and in view of reducing the hardening of the bonding wire to obtain favorable wedge bondability, the concentration of Ga and Ge in total relative to the entire wire is 1.5% by mass or less, preferably 1.4% by mass or less, and more preferably 1.3% by mass or less or 1.2% by mass or less.

In the present invention, it is preferable that the bonding wire contains one or more elements selected from As, Te, Sn, Sb, Bi and Se and a concentration of the elements in total is 0.1 to 100 ppm by mass relative to the entire wire, provided that Sn≤10 ppm by mass, Sb≤10 ppm by mass and Bi≤1 ppm by mass. The wire may contain one or more elements selected from As, Te, Sn, Sb, Bi and Se instead of the element $M_A$ and/or $M_B$ or in combination with the element $M_A$ and/or $M_B$. The one or more elements selected from As, Te, Sn, Sb, Bi and Se may also be referred to as an "element $M_C$" in the following description.

In the present invention, it is considered that when the bonding wire contains at least one or more elements selected from As, Te, Sn, Sb, Bi and Se in a certain amount as the element that provides bonding reliability in a high-temperature environment, the formation of a $Cu_9Al_4$ intermetallic compound in the bonded part tends to be further reduced. In a case where these elements are contained in a certain amount, when a ball is formed, interfacial tension between Cu of the core material and Pd of the coating layer decreases and then interfacial wettability improves, which allows Pd to be concentrated in a ball bonded interface more remarkably. It can be thus estimated that an effect of reducing a mutual diffusion of Cu and Al by the Pd concentrated layer is further enhanced, and as a result of that, a formation amount of $Cu_9Al_4$, which is likely to corrode through the action of Cl, is reduced, and then the bonding reliability of the ball bonded part in a high-temperature and high-humidity environment significantly improves.

The bonding reliability of ball bonded part in a high-temperature and high-humidity environment required for on-vehicle devices can be further improved when the bonding wire contains at least one element selected from As, Te, Sn, Sb, Bi and Se and a concentration of the at least one element in total is 0.1 to 100 ppm by mass relative to the entire wire, provided that Sn≤10 ppm by mass, Sb≤10 ppm by mass and Bi≤1 ppm by mass. It is preferable because it can increase in particular the bonding longevity of ball bonded part in a high-temperature and high-humidity environment of a temperature of 130° C. and a relative humidity of 85% required for on-vehicle devices to improve the bonding reliability. The concentration of the element in total relative to the entire wire is preferably 0.1 ppm by mass or more, more preferably 0.5 ppm by mass or more, further preferably 1 ppm by mass or more, and still further preferably 1.5 ppm by mass or more, 2 ppm by mass or more, 2.5 ppm by mass or more, or 3 ppm by mass or more. On the other hand, in view of obtaining favorable FAB shape, the concentration of the element in total relative to the entire wire is preferably 100 ppm by mass or less, and more preferably 95 ppm by mass or less, 90 ppm by mass or less, 85 ppm by mass or less, or 80 ppm by mass or less. If a concentration of Sn or Sb exceeds 10 ppm by mass or if a concentration of Bi exceeds 1 ppm by mass, an FAB shape becomes faulty. It is therefore preferable for further improving an FAB shape that Sn≤10 ppm by mass; Sb≤10 ppm by mass; and Bi≤1 ppm by mass.

It is preferable that the bonding wire of the present invention further contains at least one element selected from B, P, Mg, Ca and La and a concentration of each of the elements is 1 to 200 ppm by mass relative to the entire wire. With this configuration, there can be improved a crushed shape of a ball bonded part required for high-density mounting, that is, there can be improved a circularity of shape of a ball bonded part. In view of reducing the hardening of ball and reducing chip damage at the time of ball bonding, the concentration of each of the elements is preferably 200 ppm by mass or less, and more preferably 150 ppm by mass or less, 120 ppm by mass or less, 100 ppm by mass or less, 95 ppm by mass or less, 90 ppm by mass or less, 85 ppm by mass or less, or 80 ppm by mass or less.

When the Pd-coated Cu bonding wire contains the element that provides bonding reliability in a high-temperature environment as in the present invention, if Cu is further present at an outermost surface of the bonding wire, the formation of a $Cu_9Al_4$ intermetallic compound in the bonded part tends to be further reduced. When the Pd-coated Cu bonding wire contains the element that provides bonding reliability in a high-temperature environment, if Cu is further present at an outermost surface of the bonding wire, interaction between the elements and Cu contained in the bonding wire facilitates Pd concentration on a FAB surface during the formation of the FAB, whereby the Pd concentration on a ball bonded interface appears more remarkably. It can be estimated that with this phenomenon an effect of reducing mutual diffusion of Cu and Al by a Pd concentrated layer is further enhanced, a formation amount of $Cu_9Al_4$, which is likely to corrode through the action of Cl, is reduced, and thereby the bonding reliability of ball bonded part in a high-temperature and high-humidity environment can be further improved.

When Cu is present at an outermost surface of the Pd coating layer, if the concentration of Cu is 30 at % or more, there may be a case where the bonding wire is not suitable for practical use because a sulfur resistance of wire surface degrades and a service life of the bonding wire degrades. Consequently, when Cu is present at an outermost surface of the Pd coating layer, the concentration of Cu is preferably less than 30 at %.

When Cu is present at an outermost surface of the Au skin layer, if the concentration of Cu is 35 at % or more, there may be a case where the bonding wire is not suitable for practical use because a sulfur resistance of wire surface degrades and a service life of the bonding wire degrades. Consequently, when Cu is present at an outermost surface of the Au skin layer, the concentration of Cu is preferably less than 35 at %.

The outermost surface refers to a region of surface of the bonding wire to be measured by an Auger electron spectroscopic apparatus without performing sputtering or the like.

For a concentration analysis of the Pd coating layer and the alloy skin layer containing Au and Pd, a method of performing analysis while trimming the bonding wire from its surface in the depth direction by sputtering or the like, or a method of exposing a cross-section of the wire and performing a line analysis, a point analysis, or the like thereon is effective. For an analyzer used for such concentration analysis, an Auger electron spectroscopic apparatus installed in a scanning electron microscope or a transmission electron microscope, an energy dispersive X-ray analyzer, and an electron probe micro analyzer, etc., can be applied. As a method for exposing a cross-section of wire, a mechanical polishing, an ion etching, etc., can be applied. For a microanalysis of Ni, Zn, Rh, In, Ir and Pt in the bonding wire, a solution obtained by dissolving the bonding wire with a strong acid is analyzed using an ICP emission spectrometer or an ICP mass spectrometer, thereby enabling detection as the concentrations of elements contained in the entire bonding wire.

(Method of Manufacture)

Next, there will be described a method for manufacturing the bonding wire according to the embodiment of the present invention. The bonding wire is obtained by manufacturing a Cu alloy used for a core material, working it into a thin wire, forming a Pd coating layer and an Au layer, and performing heat treatment. After forming the Pd coating layer and the Au layer, another wire drawing and heat treatment may be performed. There will be described in detail a method for manufacturing the Cu alloy core material, a method for forming the Pd coating layer and an alloy skin layer containing Au and Pd, and a method of heat treatment.

The Cu core alloy used for a core material is obtained by melting Cu as a raw material and additive elements together and solidifying them. An arc heating furnace, a high-frequency heating furnace, a resistance heating furnace, or the like can be used for the melting. In order to prevent gases such as $O_2$ and $H_2$ being mixed therein from air, the melting is preferably performed in a vacuum atmosphere or an inert atmosphere such as Ar or $N_2$.

Examples of a method for forming the Pd coating layer and the Au layer on a surface of the Cu alloy core material include a plating method, a vapor deposition method, and a melting method. Both of an electroplating method and an electroless plating method can be used as the plating method. The electroplating called a strike plating or a flash plating is high in plating speed and is favorable in adhesiveness with a substrate. A solution used for the electroless plating is classified into a substitutional type and a reduction type. Although performing the substitutional type plating alone is sufficient for a smaller thickness, it is effective for a larger thickness to perform the reduction type plating after the substitutional type plating in a step-by-step manner.

For a vapor deposition method, there can be used a physical adsorption such as a sputtering method, an ion plating method and a vacuum vapor deposition, and a chemical adsorption such as plasma CVD. They are all dry processes, and are free from the necessity of cleaning after forming the Pd coating layer and the Au layer and from any concern about surface contamination and the like during cleaning.

When heat treatment is performed after forming the Pd coating layer and the Au layer, Pd in the Pd coating layer diffuses into the Au layer to form the alloy skin layer containing Au and Pd. Instead of forming the alloy skin layer containing Au and Pd through the heat treatment after forming the Au layer, the alloy skin layer containing Au and Pd may be deposited from the beginning.

For a formation of the Pd coating layer and the alloy skin layer containing Au and Pd, both a method of forming them after performing wire drawing to a final wire diameter and a method of forming them on a Cu alloy core material of large diameter and then performing wire drawing several times until obtaining a target wire diameter are effective. In the former in which the Pd coating layer and the alloy skin layer containing Au and Pd are formed at the final wire diameter, manufacture, quality control, and the like are simple. In the latter in which the wire drawing is performed in combination with the formed Pd coating layer and alloy skin layer containing Au and Pd, there is the advantage that adhesiveness with the Cu alloy core material improves. Specific examples of the respective formation methods include a method of forming the Pd coating layer and the alloy skin layer containing Au and Pd on a Cu alloy core material with a final diameter while successively sweeping the wire through an electroplating solution and a method of forming the Pd coating layer and the alloy skin layer containing by immersing a Cu alloy core material of large diameter into an electro or electroless plating solution and then drawing the wire to achieve a final diameter of wire.

After forming the Pd coating layer and the alloy skin layer containing Au and Pd, heat treatment may be performed. By performing the heat treatment, diffusion of atoms occurs among the alloy skin layer containing Au and Pd, the Pd coating layer and the Cu alloy core material, which improves adhesive strength therebetween and is effective in that the alloy skin layer containing Au and Pd and the Pd coating layer are prevented from peeling during working, and thus, improving productivity. In order to prevent $O_2$ being mixed therein from air, it is preferable to perform the heat treatment in a vacuum atmosphere or an inert atmosphere such as Ar or $N_2$.

As described above, when a condition of diffusion heat treatment or annealing heat treatment performed on the bonding wire are adjusted, Cu of the core material diffuses through the Pd coating layer and the skin alloy layer containing Au and Pd by grain boundary diffusion, intragrain diffusion, or the like, enabling Cu to reach an outermost surface of the bonding wire and allows Cu to be present at an outermost surface. For a heat treatment of allowing Cu to be present at an outermost surface, there can be used a heat treatment for forming the alloy skin layer containing Au and Pd as described above. When performing the heat treatment for forming the alloy skin layer, the temperature and time for heat treatment can be selected to allow Cu to be present at an outermost surface, or allow Cu to be not present at an outermost surface. Furthermore, it is also able to adjust a concentration of Cu at an outermost surface to a certain range, e.g., a range of 1 to 50 at %. Alternatively, Cu may be diffused to an outermost surface by heat treatment performed at other than the formation of the alloy skin layer.

As described above, as for addition of the element that provides bonding reliability in a high-temperature environment into the bonding wire, the effect of the invention can be exhibited by either of the method of adding the elements into the Cu core material or the method of adding these elements therein by depositing these elements onto the Cu core material or the wire surface. The same shall apply for B, P, Mg, Ca and La.

The simplest method for adding the components is a method of adding them to starting materials of the Cu alloy core material. For example, high-purity copper and raw materials of the above component element are weighed as starting raw materials and are then heated and melted in a high vacuum or in an inert atmosphere such as nitrogen and argon to produce an ingot in which the components have been added at the concentration of the intended range, thus obtaining the starting materials containing the component elements at the intended concentrations. Consequently, in a preferable embodiment, the Cu alloy core material of the bonding wire of the present invention contains at least one element selected from Ni, Zn, Rh, In, Ir and Pt so that a concentration of the elements in total relative to the entire wire will be 0.011 to 2% by mass. The preferable numerical range of the total concentration is as described above. In another preferable embodiment, the Cu alloy core material of the bonding wire of the present invention contains one or more elements selected from Ga and Ge so that a concentration of the elements in total relative to the entire wire will be 0.011 to 1.5% by mass. The preferable numerical range of the total concentration is as described above. In another preferable embodiment, the Cu alloy core material of the bonding wire of the present invention contains at least one element selected from As, Te, Sn, Sb, Bi and Se so that a concentration of the elements will be 0.1 to 100 ppm by mass, and Sn≤10 ppm by mass; Sb≤10 ppm by mass; and Bi≤1 ppm by mass. The preferable numerical range of the concentration is as described above. In a preferable embodiment, the purity of Cu of the Cu alloy core material is 3N or less (preferably 2N or less). In a conventional Pd-coated Cu bonding wire, in view of bondability, a Cu core material with high purity (4N or more) is used, and there is a tendency to avoid the use of a Cu core material with low purity. The bonding wire of the present invention containing the specific elements has achieved the bonding reliability of the ball bonded part in a high-temperature and high-humidity environment required for on-vehicle devices, especially preferably when using the Cu alloy core material of low Cu purity as described above. In another preferable embodiment, the Cu alloy core material of the bonding wire of the present invention contains at least one element selected from B, P, Mg, Ca and La so that a concentration of each of the elements relative to the entire wire will be 1 to 200 ppm by mass. The preferable numerical range of the concentration is as described above. In another preferable embodiment, the Cu alloy core material of the bonding wire of the present invention contains a metallic element of Group 10 of the Periodic Table of Elements so that a concentration of the elements in total will be 0.1 to 3.0% by mass. The preferable numerical range of the concentration is as described above.

The above components can also be contained by depositing them on a surface of wire during a manufacturing process of wire. In this case, the deposition may be incorporated into any part of the manufacturing process of wire and may be repeated several times. The deposition may also be incorporated into a plurality of processes. The components may be added to a Cu surface before Pd coating, or may be added to a Pd surface after Pd coating, or may be added to an Au surface after Au coating, or may be incorporated into each coating process. A method of deposition can be selected from (1) application of an aqueous solution, followed by drying and heat treatment, (2) plating (wet), and (3) vapor deposition (dry).

When employing the method of application of an aqueous solution, followed by drying and heat treatment, first, an aqueous solution of an appropriate concentration is prepared with a water-soluble compound containing the component elements. The components can be thus incorporated into the wire material. The preparation may be incorporated into any part of the manufacturing process of wire and may be repeated several times. The preparation may be incorporated into a plurality of processes. The components may be added to a Cu surface before Pd coating, or may be added to a Pd surface after Pd coating, or may be added to an Au surface after Au coating, or may be incorporated into each coating process.

When plating (wet) is used, plating can be either of electroplating or electroless plating. In electroplating, plating called flash plating, which is high in plating speed and favorable in adhesiveness with a substrate, can also be used in addition to normal electroplating. A solution for use in electroless plating is classified into a substitutional type and a reduction type. The substitutional type plating is generally used for a smaller thickness, whereas the reduction type is used for a larger thickness. Either of them can be used and may be selected depending on a concentration desired to be added, and a plating solution concentration and a time may be adjusted. Both electroplating and electroless plating may be incorporated into any part of the manufacturing process of wire and may be repeated several times. Both electroplating and electroless plating may be incorporated into a plurality of processes. The components may be added to a Cu surface before Pd coating, or may be added to a Pd surface after Pd coating, or may be added to an Au surface after Au coating, or may be incorporated into each coating process.

The vapor deposition (dry) includes sputtering, ion plating, vacuum deposition, plasma CVD, and the like. It has advantages in that it is dry process and eliminates pretreatment and posttreatment, giving no concern about contamination. Although vapor deposition generally has a problem that an addition speed of a target element is slow, it is one of appropriate methods in light of the object of the present invention because an addition amount of the above component elements is relatively low.

The vapor deposition may be incorporated into any part of the manufacturing process of wire or may be repeated several times. The vapor deposition may be incorporated into a plurality of processes. The components may be added to a Cu surface before Pd coating, or may be added to a Pd surface after Pd coating, or may be added to an Au surface after Au coating, or may be incorporated into each coating processes.

There will be described a method for manufacture by which, a crystal orientation <100> angled at 15 degrees or less to a wire longitudinal direction among crystal orientations in the wire longitudinal direction has a proportion of 30% or more when measuring crystal orientations on a cross-section of the core material in a direction perpendicular to a wire axis of the bonding wire, and an average crystal grain size in the cross-section of the core material in the direction perpendicular to the wire axis of the bonding wire is 0.9 to 1.5 μm.

When the bonding wire contains the element that provides bonding reliability in a high-temperature environment in the Cu alloy core material, the material strength (hardness) of the wire increases. Consequently, when performing wire drawing on the bonding wire with a Cu core wire, an area reduction rate at the time of wire drawing was as low as 5 to 8%. In heat treatment after wire drawing, the hardness is still high, and heat treatment was performed at a temperature of 600° C. or more in order to perform softening to a level capable of being used as the bonding wire. Owing to the heat treatment of high temperature, the <100> orientation proportion in the wire longitudinal direction was less than 30%, and at the same time, the average crystal grain size in the cross-section of the core material was more than 1.5 μm, and the strength ratio was more than 1.6. When decreasing heat treatment temperature in an attempt to reduce the strength ratio, the average crystal grain size in the cross-section of the core material was less than 0.9 μm, the strength ratio was less than 1.1, and the wedge bondability was inferior.

In contrast, the present invention, at the time of wire drawing using a die, sets the area reduction rate to 10% or more in half or more dies among all dies and sets the heat treatment temperature at the heat treatment after wire drawing to a low temperature of 500° C. or less. Consequently, when measuring crystal orientations on a cross-section of the core material in the direction perpendicular to the wire axis of the bonding wire, the orientation proportion of the crystal orientation <100> angled at 15 degrees or less to a wire longitudinal direction among the crystal orientations in the wire longitudinal direction could be 30% or more, and the average crystal grain size in the cross-section of the core material in the direction perpendicular to the wire axis of the bonding wire could be 0.9 to 1.5 μm. Owing to synergy of using the latest technique of wire drawing; as for a lubricant, designing a concentration of non-ionic surfactant contained in the lubricant at higher than a conventional one; as for a die shape, designing an approach angle of the die gentler than a conventional one; setting a temperature of cooling water of the die to lower than a conventional one; and the like, a wire drawing with an area reduction rate of 10% or more was enabled despite the hardening caused by the Cu alloy core material containing the components such as Ni in a total amount of 0.03% by mass or more.

When measuring crystal orientations on a cross-section of wire, an electron backscattered diffraction (EBSD) method is preferably used. The EBSD method is characterized in that it can observe crystal orientations on an observation surface and can graphically show an angle difference of the crystal orientations between adjacent measurement points. Further, the EBSD method can relatively easily observe the crystal orientations with high accuracy, even for a thin wire like the bonding wire. As for measurement of grain size, it can be determined by using analysis software installed in an apparatus for measurement results by EBSD. The crystal grain size prescribed in the present invention is obtained by performing an arithmetic mean on an equivalent diameter of crystal grains contained in a measurement area (the diameter of a circle equivalent to an area of a crystal grain; a circle-equivalent diameter).

The present invention is not limited to the above embodiments, and appropriate alterations can be made within the scope of the spirit of the present invention.

EXAMPLES

The bonding wires according to embodiments of the present invention will be described in detail below with reference to examples.

Working Examples 1 to 59 and Comparative Examples 1 to 16

(Manufacture of Sample)

First, the following describes a method for manufacturing a sample. For Cu as a raw material of a core material, Cu with a purity of 99.99% by mass or more and containing inevitable impurities as the remainder was used. For Au, Pd, Ni, Zn, Rh, In, Ir and Pt, the ones with a purity of 99% by mass or more and containing inevitable impurities as the remainder were used. Additive elements to the core material such as Ni, Zn, Rh, In, Ir and Pt are mixed so that the wire or the core material will have a desired composition. Regarding the addition of Ni, Zn, Rh, In, Ir and Pt, they can be mixed singly. Alternatively, they may be mixed so as to be a desired amount using a Cu master alloy containing the additive elements manufactured in advance if the element has a high melting point as a single body or if the element is added in an infinitesimal amount. Working examples 27 to 47 further contain one or more of Ga, Ge, As, Te, Sn, Sb, Bi, Se, B, P, Mg, Ca and La.

The Cu alloy as the core material was manufactured to give a wire diameter of a few millimeters by continuous casting. The obtained alloy with a diameter of a few millimeters was drawn to manufacture a wire with a diameter of 0.3 to 1.4 mm. A commercially available lubricant was used for the wire drawing, and a wire drawing speed was 20 to 150 m/min. In order to remove an oxide film on a surface of wire, pickling treatment with hydrochloric acid or the like was performed, and a Pd coating layer was formed by 1 to 15 µm so as to cover the entire surface of the Cu alloy as the core material. Furthermore, for some wires, an alloy skin layer containing Au and Pd was formed by 0.05 to 1.5 µm on the Pd coating layer. For the formation of the Pd coating layer and the alloy skin layer containing Au and Pd, electroplating was used. A commercially available semiconductor plating solution was used for a plating solution. Thereafter, wire drawing was performed mainly using dies with an area reduction rate of 10 to 21%, and furthermore, one to three pieces of heat treatment were performed at 200 to 500° C. during the wire drawing to perform working to a diameter of 20 µm. After working, heat treatment was performed so that breaking elongation would finally be about 5 to 15%. A method of heat treatment was performed while successively sweeping the wire and was carried out while flowing an $N_2$ or Ar gas. A wire feeding speed was 10 to 90 m/min, a heat treatment temperature was 350 to 500° C., and a heat treatment time was 1 to 10 seconds.

(Method of Evaluation)

The contents of Ni, Zn, Rh, In, Ir, Pt, Ga, Ge, As, Te, Sn, Sb, Bi, Se, B, P, Mg, Ca and La in the wire were analyzed as the concentrations of the elements contained in the entire bonding wire using an ICP emission spectrometer.

For the concentration analysis of the Pd coating layer and the alloy skin layer containing Au and Pd, Auger electron spectrometry was performed while trimming the bonding wire from its surface in the depth direction by sputtering or the like. From an obtained concentration profile in the depth direction, a thickness of the Pd coating layer, a maximum concentration of Pd in the Pd coating layer and a thickness of the alloy skin layer containing Au and Pd were determined.

The orientation proportion of the crystal orientation <100> angled at 15 degrees or less to the wire longitudinal direction among the crystal orientations in the wire longitudinal direction in the cross-section of the core material in the direction perpendicular to the wire axis of the bonding wire was calculated by observing crystal orientations of an observation surface (that is, the cross-section of the core material in the direction perpendicular to the wire axis) by EBSD. For the analysis of EBSD measurement data, exclusive software (OIM analysis manufactured by TSL Solutions, for example) was used. The average crystal grain size in the cross-section of the core material in the direction perpendicular to the wire axis was calculated by observing the crystal orientations on the observation surface by EBSD. For the analysis of EBSD measurement data, exclusive software (OIM analysis manufactured by TSL Solutions, for example) was used. The crystal grain size was obtained by performing an arithmetic mean on an equivalent diameter of crystal grains contained in a measurement area (the diameter of a circle equivalent to an area of a crystal grain; a circle-equivalent diameter).

The 0.2% offset yield strength and the ultimate strength were evaluated by performing a tensile test with an inter-mark distance of 100 mm. A universal material test machine Type 5542 manufactured by Instron was used for a tensile test apparatus. The 0.2% offset yield strength was calculated using exclusive software installed in the apparatus. A load at the time of breaking was determined to be the ultimate strength. The strength ratio was calculated from the following Equation (1)

$$\text{Strength ratio} = \text{ultimate strength}/0.2\% \text{ offset yield strength.} \quad (1)$$

The evaluation of the wedge bondability in the wire bonded part was determined by performing 1,000 pieces of bonding on wedge bonding parts of a BGA substrate and by the occurrence frequency of peeling of the bonded parts. The used BGA substrate was plated with Ni and Au. In this evaluation, assuming bonding conditions more rigorous than normal, a stage temperature was set to 150° C., which was lower than a general set temperature range. In the evaluation, a case in which 11 or more failures occurred was determined to be problematic to be marked with a symbol of "cross," a case of 6 to 10 failures was determined to be practicable but somewhat problematic to be marked with a symbol of "triangle," a case of 1 to 5 failures was determined to be no problem to be marked with a symbol of "circle," and a case in which no failure occurred was determined to be excellent to be marked with a symbol of "double circle" in the column "wedge bondability" in Tables 1 to 4.

The bonding reliability of the ball bonded part in a high-temperature and high humidity environment or a high-temperature environment was determined by manufacturing a sample for bonding reliability evaluation, performing HTS evaluation, and evaluating the bonding longevity of the ball bonded part. The sample for bonding reliability evaluation was manufactured by performing ball bonding onto an electrode, which has been formed by forming an alloy of Al-1.0% Si-0.5% Cu as a film with a thickness of 0.8 µm on a Si substrate on a general metallic frame, using a commercially available wire bonder and sealing it with a commercially available epoxy resin. A ball was formed while flowing an $N_2+5\%$ $H_2$ gas at a flow rate of 0.4 to 0.6 L/min, and its size was within the range of a diameter of 33 to 34 µm.

For the HTS evaluation, the manufactured sample for bonding reliability evaluation was exposed to a high-temperature environment with a temperature of 200° C. using a high-temperature thermostatic device. A shear test on the ball bonded part was performed every 500 hours, and a time until a value of shear strength became half of the initial shear strength was determined to be the bonding longevity of the ball bonded part. The shear test after the high-temperature and high-humidity test was performed after removing the resin by acid treatment and exposing the ball bonded part.

A tester manufactured by DAGE was used for a shear tester for the HTS evaluation. An average value of measurement values of 10 ball bonded parts randomly selected was used for the value of the shear strength. In the above evaluation, the bonding longevity being 500 hours or more and less than 1,000 hours was determined to be practicable but desired to be improved to be marked with a symbol of "triangle," being 1,000 hours or more and less than 3,000 hours was determined to be practically no problem to be marked with a symbol of "circle," and being 3,000 hours or more was determined to be especially excellent to be marked with a symbol of "double circle" in the column "HTS" in Tables 1 to 4.

For the evaluation of ball formability (FAB shape), a ball before performing bonding was collected and observed, and the presence or absence of voids on a surface of the ball and the presence or absence of deformation of the ball, which is primarily a perfect sphere, were determined. The occurrence of any of the above was determined to be faulty. The formation of the ball was performed while blowing an $N_2$ gas at a flow rate of 0.5 L/min in order to reduce oxidation in a melting process. The size of the ball was 34 µm. For one condition, 50 balls were observed. A SEM was used for the observation. In the evaluation of the ball formability, a case in which five or more failures occurred was determined to be problematic to be marked with a symbol of "cross," a case of three or four failures was determined to be practicable but somewhat problematic to be marked with a symbol of "triangle," a case of one or two failures was determined to be no problem to be marked with a symbol of "circle," and a case in which no failure occurred was determined to be excellent to be marked with a symbol of "double circle" in the column "FAB shape" in Tables 1 to 4.

The bonding longevity of the ball bonded part in the high-temperature and high-humidity environment with a temperature of 130° C. and a relative humidity of 85% can be evaluated by the following HAST evaluation. For the HAST evaluation, the manufactured sample for bonding reliability evaluation was exposed to a high-temperature and high-humidity environment with a temperature of 130° C. and a relative humidity of 85% using an unsaturated type pressure cooker tester and was biased with 5 V. A shear test on the ball bonded part was performed every 48 hours, and a time until a value of shear strength became half of the initial shear strength was determined to be the bonding longevity of the ball bonded part. The shear test after the high-temperature and high-humidity test was performed after removing the resin by acid treatment and exposing the ball bonded part.

A tester manufactured by DAGE was used for a shear tester for the HAST evaluation. An average value of measurement values of 10 ball bonded parts randomly selected was used for the value of the shear strength. In the above evaluation, the bonding longevity being 144 hours or more and less than 288 hours was determined to be practically no problem to be marked with a symbol of "circle," being 288 hours or more and less than 384 hours was determined to be excellent to be marked with a symbol of "double circle," and being 384 hours or more was determined to be especially excellent to be marked with a symbol of "a pair of double circles" in the column "HAST" in Tables 1 to 4.

The evaluation of a crushed shape of the ball bonded part was determined by observing the ball bonded part from immediately above after bonding and evaluating by its circularity. For a bonding counterpart, an electrode in which an Al-0.5% Cu alloy was formed as a film with a thickness of 1.0 µm on a Si substrate was used. The observation was performed using an optical microscope, and 200 sites were observed for one condition. Being elliptic with large deviation from a perfect circle and being anisotropic in deformation were determined to be faulty in the crushed shape of the ball bonded part. In the above evaluation, a case in which one to three failures was determined to be no problem to be marked with a symbol of "circle," and a case in which a favorable perfect circle was obtained for all was determined to be especially excellent to be marked with a symbol of "double circle" in the column "crushed shape" in Tables 1 to 4.

TABLE 1

| | | Additive element (% by mass) | | | | | | | | Coating layer | | | Crystal structure | |
| | | | | | | | | | | | | | <100> | |
| | | | $M_A$ | | | | | $M_A$ | | | Pd maximum | Thickness of | Proportion | Average |
| | | | | | | | | | | Thickness | concentration | alloy skin layer | of wire C section | crystal grain size |
| | No. | Ni | Pt | Zn | Rh | In | Ir | in total | Other | (µm) | (at %) | (µm) | (%) | (µm) |
| Working Example | 1 | 0.7 | | | | | | 0.7 | | 0.015 | 97 | — | 92 | 1.1 |
| | 2 | | 1.2 | | | | | 1.2 | | 0.050 | 100 | — | 72 | 0.9 |
| | 3 | | | 1.0 | | | | 1.0 | | 0.100 | 100 | — | 71 | 1.0 |
| | 4 | | | | 0.5 | | | 0.5 | | 0.150 | 100 | — | 72 | 1.1 |

TABLE 1-continued

| No. | Ni | Pt | Zn | Rh | In | Ir | M_A in total | Pd thickness (μm) | Pd max concentration (at %) | Thickness of alloy skin layer (μm) | <100> Proportion of wire C section (%) | Average crystal grain size (μm) |
|---|---|---|---|---|---|---|---|---|---|---|---|---|
| 5 | | | | | 0.1 | | 0.1 | 0.015 | 98 | — | 75 | 1.2 |
| 6 | | 0.03 | | | | | 0.03 | 0.050 | 100 | — | 63 | 1.3 |
| 7 | 1.1 | | | 0.3 | | | 1.4 | 0.100 | 100 | — | 75 | 1.0 |
| 8 | | | 1.2 | | 0.8 | | 2.0 | 0.150 | 100 | — | 65 | 0.9 |
| 9 | | 0.1 | | 0.7 | | | 0.8 | 0.150 | 98 | — | 51 | 1.2 |
| 10 | 0.6 | | | 0.1 | | 0.05 | 0.75 | 0.100 | 100 | — | 97 | 1.2 |
| 11 | | | 0.8 | | 0.8 | 0.3 | 1.9 | 0.150 | 100 | — | 80 | 1.1 |
| 12 | 0.05 | 0.05 | | 0.05 | | | 0.15 | 0.015 | 99 | — | 70 | 1.2 |
| 13 | | 0.3 | 1.0 | | | 0.1 | 1.4 | 0.015 | 97 | — | 54 | 1.0 |
| 14 | 0.5 | | | | | | 0.5 | 0.015 | 98 | 0.0005 | 91 | 1.1 |
| 15 | | 1.2 | | | | | 1.2 | 0.050 | 100 | 0.0010 | 70 | 0.9 |
| 16 | | | 0.7 | | | | 0.7 | 0.100 | 100 | 0.0100 | 69 | 1.1 |
| 17 | | | | 0.3 | | | 0.3 | 0.150 | 100 | 0.0500 | 70 | 1.2 |
| 18 | | | | | 0.1 | | 0.1 | 0.015 | 98 | 0.0005 | 76 | 1.2 |
| 19 | | 0.05 | | | | | 0.05 | 0.050 | 100 | 0.0010 | 64 | 1.3 |
| 20 | 0.5 | | | 0.3 | | | 0.8 | 0.100 | 100 | 0.0100 | 74 | 1.1 |
| 21 | | 1.2 | | | 0.1 | | 1.3 | 0.150 | 100 | 0.0500 | 64 | 1.2 |
| 22 | | 0.01 | | 0.7 | | | 0.71 | 0.015 | 99 | 0.0005 | 50 | 1.1 |
| 23 | 0.6 | | | 0.1 | | 0.05 | 0.75 | 0.050 | 100 | 0.0010 | 98 | 1.0 |
| 24 | | | 0.8 | | 0.8 | 0.3 | 1.9 | 0.100 | 100 | 0.0100 | 85 | 0.9 |
| 25 | 0.05 | 0.05 | | 0.05 | | | 0.15 | 0.150 | 100 | 0.0500 | 74 | 1.3 |
| 26 | | 0.3 | 1.0 | | | 0.1 | 1.4 | 0.015 | 97 | 0.0100 | 51 | 0.9 |

| | No. | Mechanical characteristics | | | Wire quality | | | | |
|---|---|---|---|---|---|---|---|---|---|
| | | Ultimate strength ① (mN/μm²) | 0.2% Offset yield strength ② (mN/μm²) | Strength ratio ①/② | Wedge bondability | HTS | FAB shape | HAST | Crushed shape |
| Working Example | 1 | 0.19 | 0.16 | 1.19 | ◎ | ◎ | ○ | ○ | ○ |
| | 2 | 0.22 | 0.17 | 1.29 | ◎ | ◎ | ◎ | ○ | ○ |
| | 3 | 0.24 | 0.16 | 1.50 | ○ | ◎ | ◎ | ○ | ○ |
| | 4 | 0.29 | 0.24 | 1.21 | ◎ | ◎ | ○ | ○ | ○ |
| | 5 | 0.30 | 0.22 | 1.36 | ◎ | ◎ | ○ | ○ | ○ |
| | 6 | 0.31 | 0.20 | 1.55 | ○ | ◎ | ◎ | ○ | ○ |
| | 7 | 0.33 | 0.28 | 1.18 | ◎ | ◎ | ○ | ○ | ○ |
| | 8 | 0.34 | 0.27 | 1.26 | ◎ | ◎ | ○ | ○ | ○ |
| | 9 | 0.35 | 0.22 | 1.59 | ○ | ◎ | ○ | ○ | ○ |
| | 10 | 0.33 | 0.30 | 1.10 | ◎ | ◎ | ○ | ○ | ○ |
| | 11 | 0.34 | 0.28 | 1.21 | ◎ | ◎ | ○ | ○ | ○ |
| | 12 | 0.35 | 0.22 | 1.59 | ○ | ◎ | ○ | ○ | ○ |
| | 13 | 0.35 | 0.23 | 1.52 | ◎ | ◎ | ○ | ○ | ○ |
| | 14 | 0.20 | 0.18 | 1.11 | ◎ | ◎ | ○ | ○ | ○ |
| | 15 | 0.21 | 0.17 | 1.24 | ◎ | ◎ | ◎ | ○ | ○ |
| | 16 | 0.22 | 0.15 | 1.47 | ◎ | ◎ | ◎ | ○ | ○ |
| | 17 | 0.28 | 0.24 | 1.17 | ◎ | ◎ | ○ | ○ | ○ |
| | 18 | 0.29 | 0.22 | 1.32 | ◎ | ◎ | ○ | ○ | ○ |
| | 19 | 0.30 | 0.19 | 1.58 | ◎ | ◎ | ◎ | ○ | ○ |
| | 20 | 0.33 | 0.28 | 1.18 | ◎ | ◎ | ◎ | ○ | ○ |
| | 21 | 0.34 | 0.26 | 1.31 | ◎ | ◎ | ○ | ○ | ○ |
| | 22 | 0.35 | 0.23 | 1.52 | ○ | ◎ | ○ | ○ | ○ |
| | 23 | 0.30 | 0.20 | 1.50 | ◎ | ◎ | ◎ | ○ | ○ |
| | 24 | 0.33 | 0.29 | 1.14 | ◎ | ◎ | ○ | ○ | ○ |
| | 25 | 0.34 | 0.25 | 1.36 | ◎ | ◎ | ○ | ○ | ○ |
| | 26 | 0.35 | 0.25 | 1.40 | ◎ | ◎ | ○ | ○ | ○ |

TABLE 2

| | No. | Additive element (% by mass) | | | | | | | | Coating layer | | Thickness of alloy skin layer (μm) | Crystal structure | |
|---|---|---|---|---|---|---|---|---|---|---|---|---|---|---|
| | | M_A | | | | | | M_A in total | other | Pd Thickness (μm) | Pd maximum concentration (at %) | | <100> Proportion of wire C section (%) | Average crystal grain size (μm) |
| | | Ni | Pt | Zn | Rh | In | Ir | | | | | | | |
| Working Example | 27 | 0.7 | | | | | | 0.7 | Ga: 0.007 | 0.100 | 100 | — | 88 | 0.9 |
| | 28 | | 1.1 | | | | | 1.1 | Ge: 0.008 | 0.050 | 100 | — | 75 | 1.0 |
| | 29 | | | 0.7 | | | | 0.7 | As: 0.003 | 0.050 | 100 | — | 72 | 1.0 |
| | 30 | | | | 1.2 | | | 1.2 | Te: 0.001 | 0.150 | 100 | — | 67 | 1.2 |
| | 31 | | | | | | 0.5 | 0.5 | Sn: 0.0007 | 0.015 | 96 | — | 66 | 1.0 |
| | 32 | | 0.05 | | | | | 0.05 | Sb: 0.0008 | 0.050 | 100 | — | 74 | 1.1 |

TABLE 2-continued

| No. | c1 | c2 | c3 | c4 | c5 | Sum | Other | v1 | v2 | v3 | v4 | v5 | v6 |
|---|---|---|---|---|---|---|---|---|---|---|---|---|---|
| 33 | 1.0 |  |  |  |  | 1.0 | Bi: 0.00008 | 0.100 | 100 | — | 80 | 1.1 |  |
| 34 |  | 0.8 |  |  |  | 0.8 | Se: 0.0001 | 0.100 | 100 | — | 92 | 0.9 |  |
| 35 |  |  | 0.05 |  |  | 0.05 | Ga: 0.003<br>Te: 0.0008 | 0.100 | 100 | — | 72 | 1.2 |  |
| 36 |  |  |  | 0.08 |  | 0.08 | Ge: 0.003<br>Sb: 0.0007 | 0.150 | 100 | 0.0050 | 55 | 1.3 |  |
| 37 |  |  |  |  | 0.1 | 0.1 | As: 0.001<br>Se: 0.001 | 0.150 | 100 | 0.0100 | 62 | 1.1 |  |
| 38 | 0.08 |  |  |  |  | 0.05 | B: 0.0008 | 0.050 | 100 | — | 74 | 1.1 |  |
| 39 |  | 1.2 |  |  |  | 1.2 | P: 0.004 | 0.050 | 100 | — | 77 | 1.2 |  |
| 40 |  |  | 0.05 |  |  | 0.05 | Mg: 0.005 | 0.100 | 100 | — | 91 | 1.0 |  |
| 41 |  |  |  | 0.5 |  | 0.5 | Ca: 0.003 | 0.015 | 95 | — | 68 | 1.0 |  |
| 42 |  |  |  |  | 0.1 | 0.1 | La: 0.003 | 0.100 | 100 | 0.0100 | 91 | 0.9 |  |
| 43 |  | 0.05 |  |  |  | 0.05 | P: 0.006<br>B: 0.0008 | 0.050 | 100 | 0.0050 | 68 | 1.1 |  |
| 44 | 0.6 |  |  |  |  | 0.6 | P: 0.003<br>Ca: 0.001 | 0.015 | 100 | 0.0100 | 57 | 1.3 |  |
| 45 | 0.5 |  |  |  |  | 0.5 | B: 0.015 | 0.100 | 100 | 0.0100 | 90 | 0.9 |  |
| 46 |  | 0.5 |  |  |  | 0.5 | P: 0.02 | 0.050 | 100 | 0.0050 | 67 | 1.1 |  |
| 47 |  |  | 0.5 |  |  | 0.5 | La: 0.018 | 0.015 | 100 | 0.0100 | 56 | 1.3 |  |
| 48 | 0.011 |  |  |  |  | 0.011 |  | 0.015 | 98 | — | 75 | 1.0 |  |
| 49 |  | 0.011 |  |  |  | 0.011 |  | 0.050 | 100 | — | 72 | 1.0 |  |
| 50 |  |  | 0.011 |  |  | 0.011 |  | 0.100 | 100 | — | 67 | 1.2 |  |
| 51 |  |  |  | 0.011 |  | 0.011 |  | 0.150 | 100 | — | 66 | 1.0 |  |
| 52 |  |  |  |  | 0.011 | 0.011 |  | 0.050 | 100 | — | 74 | 1.1 |  |
| 53 |  |  |  |  |  | 0.011 0.011 |  | 0.100 | 100 | — | 80 | 0.9 |  |

|  | No. | Mechanical characteristics ||| Wire quality |||||
|---|---|---|---|---|---|---|---|---|---|
|  |  | Ultimate strength ① (mN/μm²) | 0.2% Offset yield strength ② (mN/μm²) | Strength ratio ①/② | Wedge bondability | HTS | FAB shape | HAST | Crushed shape |
| Working Example | 27 | 0.22 | 0.18 | 1.22 | ◎ | ◎ | ◎ | ◎ | ○ |
|  | 28 | 0.25 | 0.17 | 1.47 | ◎ | ◎ | ◎ | ◎ | ○ |
|  | 29 | 0.30 | 0.21 | 1.43 | ◎ | ◎ | ◎ | ◎ | ○ |
|  | 30 | 0.31 | 0.24 | 1.29 | ◎ | ◎ | ○ | ◎ | ○ |
|  | 31 | 0.29 | 0.22 | 1.32 | ◎ | ◎ | ○ | ◎ | ○ |
|  | 32 | 0.35 | 0.29 | 1.21 | ◎ | ◎ | ◎ | ◎ | ○ |
|  | 33 | 0.31 | 0.22 | 1.41 | ◎ | ◎ | ◎ | ◎ | ○ |
|  | 34 | 0.27 | 0.19 | 1.42 | ◎ | ◎ | ◎ | ◎ | ○ |
|  | 35 | 0.30 | 0.19 | 1.58 | ○ | ◎ | ◎ | ◎ | ○ |
|  | 36 | 0.33 | 0.25 | 1.32 | ◎ | ◎ | ○ | ◎ | ○ |
|  | 37 | 0.32 | 0.25 | 1.28 | ◎ | ◎ | ○ | ◎ | ○ |
|  | 38 | 0.34 | 0.23 | 1.48 | ◎ | ◎ | ◎ | ○ | ◎ |
|  | 39 | 0.29 | 0.20 | 1.45 | ◎ | ◎ | ◎ | ○ | ◎ |
|  | 40 | 0.33 | 0.28 | 1.18 | ◎ | ◎ | ◎ | ○ | ◎ |
|  | 41 | 0.23 | 0.19 | 1.21 | ◎ | ◎ | ○ | ○ | ◎ |
|  | 42 | 0.26 | 0.21 | 1.24 | ◎ | ◎ | ◎ | ○ | ◎ |
|  | 43 | 0.29 | 0.19 | 1.53 | ○ | ◎ | ◎ | ○ | ◎ |
|  | 44 | 0.33 | 0.24 | 1.38 | ◎ | ◎ | ○ | ○ | ◎ |
|  | 45 | 0.25 | 0.21 | 1.19 | ◎ | ◎ | ◎ | ○ | ◎ |
|  | 46 | 0.28 | 0.19 | 1.47 | ◎ | ◎ | ◎ | ○ | ◎ |
|  | 47 | 0.33 | 0.24 | 1.38 | ◎ | ◎ | ○ | ○ | ◎ |
|  | 48 | 0.21 | 0.18 | 1.17 | ◎ | ○ | ○ | ○ | ○ |
|  | 49 | 0.19 | 0.16 | 1.19 | ◎ | ○ | ◎ | ○ | ○ |
|  | 50 | 0.23 | 0.19 | 1.21 | ◎ | ○ | ◎ | ○ | ○ |
|  | 51 | 0.22 | 0.18 | 1.22 | ◎ | ○ | ○ | ○ | ○ |
|  | 52 | 0.21 | 0.18 | 1.17 | ◎ | ○ | ◎ | ○ | ○ |
|  | 53 | 0.23 | 0.2 | 1.15 | ◎ | ○ | ◎ | ○ | ○ |

TABLE 3

| | No. | Additive element (% by mass) | | | | | | | | Coating layer | | Thickness of alloy skin layer (μm) | Crystal structure | |
|---|---|---|---|---|---|---|---|---|---|---|---|---|---|---|
| | | $M_A$ | | | | | | $M_A$ in total | Other | Thickness (μm) | Pd maximum concentration (at %) | | <100> Proportion of wire C section (%) | Average crystal grain size (μm) |
| | | Ni | Pt | Zn | Rh | In | Ir | | | | | | | |
| Working Example | 54 | 0.02 | | | | | | 0.02 | | 0.015 | 97 | — | 30 | 1 |
| | 55 | | 0.02 | | | | | 0.02 | | 0.05 | 100 | — | 41 | 1 |
| | 56 | | | 0.02 | | | | 0.02 | | 0.1 | 100 | — | 49 | 1.2 |
| | 57 | | | | 0.02 | | | 0.02 | | 0.15 | 100 | — | 52 | 1.3 |
| | 58 | | | | | 0.02 | | 0.02 | | 0.05 | 100 | — | 60 | 1.4 |
| | 59 | | | | | | 0.02 | 0.02 | | 0.1 | 100 | — | 74 | 1.5 |

| | No. | Mechanical characteristics | | | Wire quality | | | | |
|---|---|---|---|---|---|---|---|---|---|
| | | Ultimate strength ① (mN/μm²) | 0.2% Offset yield strength ② (mN/μm²) | Strength ratio ①/② | Wedge bondability | HTS | FAB shape | HAST | Crushed shape |
| Working Example | 54 | 0.31 | 0.24 | 1.29 | ◎ | ○ | ○ | ○ | ○ |
| | 55 | 0.33 | 0.22 | 1.50 | ◎ | ○ | ◎ | ○ | ○ |
| | 56 | 0.28 | 0.19 | 1.47 | ◎ | ○ | ◎ | ○ | ○ |
| | 57 | 0.32 | 0.27 | 1.19 | ◎ | ○ | ○ | ○ | ○ |
| | 58 | 0.22 | 0.18 | 1.22 | ◎ | ○ | ◎ | ○ | ○ |
| | 59 | 0.25 | 0.20 | 1.25 | ◎ | ○ | ◎ | ○ | ○ |

TABLE 4

| | No. | Additive element | | | | | | | | | | | | | | Pd coating layer | | Thickness of alloy skin layer (μm) |
|---|---|---|---|---|---|---|---|---|---|---|---|---|---|---|---|---|---|---|
| | | Ni | Pd | Pt | Zn | Rh | In | Ir | Ga | Ge | As | Te | Sn | Sb | Bi | Se | Thickness (μm) | Pd maximum concentration (at %) | |
| | | (% by mass) (Amount in core material for Pd (% by mass)) | | | | | | | | | (ppm by mass) | | | | | | | | |
| Comparative Example | 1 | 0.7 | | | | | | | | | | | | | | | 0.015 | 98 | — |
| | 2 | | | | | 1.2 | | | 0.8 | | | | | | | | 0.150 | 100 | — |
| | 3 | 0.6 | | | | | 0.1 | 0.05 | | | | | | | | | 0.100 | 100 | — |
| | 4 | | | 0.03 | | | | | | | | | | | | | 0.050 | 100 | — |
| | 5 | | | 0.1 | | 0.7 | | | | | | | | | | | 0.015 | 96 | — |
| | 6 | | | | 0.8 | | 0.8 | 0.3 | | | | | | | | | 0.150 | 100 | — |
| | 7 | | 0.7 | | 1.2 | | | | | | | | | | | | 0.050 | 100 | — |
| | 8 | 1.1 | | | | | | 0.3 | | | | | | | | | 0.100 | 100 | — |
| | 9 | 0.05 | | 0.05 | | 0.05 | | | | | | | | | | | 0.015 | 97 | — |
| | 10 | | | | | | 0.05 | | 1.2 | 0.9 | | | | | | | 0.015 | 98 | — |
| | 11 | | | | | | 1 | | | | | | 1.1 | 1.1 | | 1.1 | 0.15 | 100 | — |
| | 12 | | | | | | | | 0.05 | 1.3 | | 1.1 | | | | | 0.1 | 100 | — |
| | 13 | | | | | | | | 1 | 1.1 | | | 1.2 | 0.8 | | | 0.05 | 100 | — |
| | 14 | | | | | | 0.05 | 0.05 | | | 1.1 | 0.9 | | | | 1.2 | 0.015 | 96 | — |
| | 15 | | | | | | | | | | | | | | | | 0.15 | 100 | — |
| | 16 | | | | | | | | | | | | | | | | 0.05 | 100 | — |

| | No. | Crystal structure | | Mechanical characteristics | | | Wire quality | | | | |
|---|---|---|---|---|---|---|---|---|---|---|---|
| | | <100> Proportion of wire C section (%) | Average crystal grain size (μm) | Ultimate strength ① (mN/μm²) | 0.2% Offset yield strength ② (mN/μm²) | Strength ratio ①/② | Wedge bondability | HTS | FAB shape | HAST | Crushed shape |
| Comparative Example | 1 | 50 | 0.8 | 0.35 | 0.32 | 1.09 | X | ◎ | ○ | ○ | ○ |
| | 2 | 29 | 1.7 | 0.29 | 0.16 | 1.81 | X | ◎ | ○ | ○ | ○ |
| | 3 | 51 | 0.7 | 0.28 | 0.26 | 1.08 | X | ◎ | ◎ | ○ | ○ |
| | 4 | 25 | 0.9 | 0.21 | 0.12 | 1.75 | X | ◎ | ◎ | ○ | ○ |
| | 5 | 20 | 1.1 | 0.30 | 0.17 | 1.76 | X | ◎ | ○ | ○ | ○ |
| | 6 | 21 | 1.6 | 0.35 | 0.19 | 1.84 | X | ◎ | ○ | ○ | ○ |
| | 7 | 22 | 1.0 | 0.21 | 0.12 | 1.75 | X | ◎ | ◎ | ○ | ○ |
| | 8 | 25 | 1.6 | 0.30 | 0.18 | 1.67 | Δ | ◎ | ◎ | ○ | ○ |
| | 9 | 28 | 1.8 | 0.34 | 0.20 | 1.70 | Δ | ◎ | ○ | ○ | ○ |

TABLE 4-continued

| | | | | | | | | | | |
|---|---|---|---|---|---|---|---|---|---|---|
| 10 | 22 | 0.8 | 0.20 | 0.19 | 1.05 | X | Δ | ○ | ⊚ | ○ |
| 11 | 23 | 0.7 | 0.26 | 0.24 | 1.08 | X | Δ | ○ | ⊚ | ○ |
| 12 | 25 | 0.9 | 0.35 | 0.21 | 1.67 | Δ | Δ | ⊚ | ⊚ | ○ |
| 13 | 23 | 1.1 | 0.31 | 0.19 | 1.63 | Δ | Δ | ⊚ | ⊚ | ○ |
| 14 | 22 | 1.6 | 0.24 | 0.14 | 1.71 | X | Δ | ○ | ⊚ | ○ |
| 15 | 92 | 1.1 | 0.21 | 0.12 | 1.75 | X | X | ○ | X | ○ |
| 16 | 45 | 1.4 | 0.34 | 0.21 | 1.62 | Δ | X | ⊚ | X | ○ |

(Evaluation Results)

The bonding wires according to Working Examples 1 through 59 each contain Ni, Zn, Rh, In, Ir or Pt in an amount of 0.011 to 2% by mass and the strength ratio (=ultimate strength/0.2% offset yield strength) thereof is within a range of 1.1 to 1.6, and they achieved favorable result in both of the high-temperature reliability of the ball bonded part in the HTS evaluation and the wedge bondability. For the bonding wire of the present invention, the area reduction rate at the time of wire drawing was 10% or more, and the heat treatment temperature after wire drawing was a low temperature of 500° C. or less, whereby, the crystal orientation <100> angled at 15 degrees or less to the wire longitudinal direction among the crystal orientations in the wire longitudinal direction could be 30% or more when measuring crystal orientations on the cross-section of the core material in the direction perpendicular to the wire axis of the bonding wire, and the average crystal grain size in the cross-section of the core material in the direction perpendicular to the wire axis of the bonding wire could be 0.9 to 1.5 μm. It is thus considered that the strength ratio could be within the range described above.

The bonding wires according to Working Examples each include a Cu alloy core material and a Pd coating layer formed on a surface of the Cu alloy core material, and a thickness of the Pd coating layer is in the preferable range of 0.015 to 0.150 μm. All of them exhibited favorable FAB shape.

On the other hand, in Comparative Examples 1, 3, 10 and 11 with the strength ratio of less than 1.1, the wedge bondability was faulty in all cases. In Comparative Examples 2, 4 to 9, 12 to 16 with the strength ratio of more than 1.6, the wedge bondability was faulty or problematic. In particular, in Comparative Examples 15 and 16, HTS and HAST were also faulty because the element that provides bonding reliability in a high-temperature environment was not contained in the wire. Part of the reason for low strength ratio in Comparative Examples 1, 3, 10 and 11 is considered due to the fact that the average crystal grain size in the cross-section of the core material was less than 0.9 μm because of die area reduction rate of less than 10%. Part of the reason for increased strength ratio in Comparative Examples 2, 4 to 9, 12 to 14 is considered due to the fact that the <100> orientation proportion in the wire longitudinal direction was less than 30% because of high heat treatment temperature of 600° C. or more. In particular, in Comparative Examples 2, 6, 8, 9 and 14, part of the reason is also considered due to the fact that the average crystal grain size in the cross-section of the core material was more than 1.5 μm because of high heat treatment temperature of 620° C. or more.

Working Examples 2-1 to 2-40

(Sample)

First, the following describes a method for manufacturing a sample. For Cu as a raw material of the core material, Cu with a purity of 99.99% by mass or more and containing inevitable impurities as the remainder was used. For Ga, Ge, Ni, Ir, Pt, Pd, B, P and Mg, the ones with purity of 99% by mass or more and containing inevitable impurities as the remainder were used. Ga, Ge, Ni, Ir, Pt, Pd, B, P and Mg as additive elements to the core material are mixed so that the wire or the core material will have a desired composition. Regarding the addition of Ga, Ge, Ni, Ir, Pt, Pd, B, P and Mg, they can be mixed singly. Alternatively, they may be mixed so as to be a desired amount using a Cu master alloy containing the additive elements manufactured in advance if the element has a high melting point as a single body or if the element is added in an infinitesimal amount.

The Cu alloy as the core material was manufactured by charging raw materials into a carbon crucible worked into a cylindrical shape with a diameter of 3 to 6 mm, heating and melting the raw materials at 1,090 to 1,300° C. in vacuum or in an inert atmosphere such as an $N_2$ or Ar gas using a high-frequency furnace, and performing furnace cooling. The obtained alloy with a diameter of 3 to 6 mm was drawn to be worked into a diameter of 0.9 to 1.2 mm, and a wire with a diameter of 300 to 600 μm was manufactured by successively performing wire drawing using dies. A commercially available lubricant was used for the wire drawing, and a wire drawing speed was 20 to 150 m/min. In order to remove an oxide film on a surface of wire, pickling treatment with sulfuric acid was performed, and a Pd coating layer was formed by 1 to 15 μm so as to cover the entire surface of the Cu alloy as the core material. Furthermore, for some wires, an alloy skin layer containing Au and Pd was formed by 0.05 to 1.5 μm on the Pd coating layer. For the formation of the Pd coating layer and the alloy skin layer containing Au and Pd, electroplating was used. A commercially available semiconductor plating solution was used for a plating solution. Heat treatment at 200 to 500° C. and wire drawing were then repeatedly performed to be worked into a diameter of 20 μm. After working, heat treatment was performed while flowing an $N_2$ or Ar gas so that breaking elongation will finally be about 5 to 15%. A method of heat treatment was performed while successively sweeping the wire and was performed while flowing an $N_2$ or Ar gas. A wire feeding speed was 20 to 200 m/min, a heat treatment temperature was 200 to 600° C., and a heat treatment time was 0.2 to 1.0 second.

For the concentration analysis of the Pd coating layer and the alloy skin layer containing Au and Pd, the analysis was performed using an Auger electron spectroscopic apparatus while sputtering the bonding wire from its surface in the depth direction with Ar ions. The thicknesses of the coating layer and the skin alloy layer were determined from an obtained concentration profile (the unit of the depth was in terms of $SiO_2$) in the depth direction. A region in which a concentration of Pd was 50 at % or more and a concentration of Au was less than 10 at % was determined to be the Pd coating layer, and a region in which a concentration of Au was in a range of 10 at % or more on a surface of the Pd coating layer was determined to be the alloy skin layer. The thicknesses of the coating layer and the alloy skin layer and a maximum concentration of Pd are listed in Tables 5 and 6. The concentration of Pd in the Cu alloy core material was measured by a method that exposes a cross-section of wire and performs line analysis, point analysis, or the like on the exposed cross-section of wire by an electron probe micro analyzer installed in a scanning electron microscope. For the method for exposing the cross-section of wire, mechanical polishing, ion etching, or the like was used. For the concentrations of Ga, Ge, Ni, Ir, Pt, B, P and Mg in the bonding wire, a solution obtained by dissolving the bonding wire with a strong acid was analyzed using an ICP emission spectrometer or an ICP mass spectrometer, and they were detected as the concentrations of the elements contained in the entire bonding wire.

The configurations of the respective samples manufactured according to the above procedure are listed in the following Tables 5 and 6.

TABLE 5

|  |  | Additive element |  |  |  |  |  |  |  |  | Coating layer |  | Thickness of alloy skin layer (μm) |
|---|---|---|---|---|---|---|---|---|---|---|---|---|---|
|  |  | $M_B$ |  |  | $M_A$ |  |  | Other |  |  |  | Pd maximum |  |
|  | No. | Ga (% by mass) | Ge | $M_B$ in total | Ni (% by mass) | Pd | Pt | Ir | B (ppm by mass) | P | Mg | Thickness (μm) | concentration (at %) |  |
| Working Example | 2-1 | 0.025 |  | 0.025 |  |  |  |  |  |  |  | 0.015 | 98 | 0.0005 |
|  | 2-2 | 0.500 |  | 0.500 |  |  |  |  |  |  |  | 0.1 | 100 | 0.0005 |
|  | 2-3 | 1.500 |  | 1.500 |  |  |  |  |  |  |  | 0.05 | 100 | 0.001 |
|  | 2-4 |  | 0.011 | 0.011 |  |  |  |  |  |  |  | 0.1 | 100 | 0.001 |
|  | 2-5 |  | 0.025 | 0.025 |  |  |  |  |  |  |  | 0.05 | 100 | 0.08 |
|  | 2-6 |  | 0.300 | 0.300 |  |  |  |  |  |  |  | 0.05 | 100 | 0.01 |
|  | 2-7 |  | 1.500 | 1.500 |  |  |  |  |  |  |  | 0.1 | 100 | 0.01 |
|  | 2-8 | 0.015 | 0.011 | 0.026 |  |  |  |  |  |  |  | 0.05 | 100 | 0.001 |
|  | 2-9 | 0.050 | 0.600 | 0.650 |  |  |  |  |  |  |  | 0.05 | 100 | 0.01 |
|  | 2-10 | 0.600 | 0.850 | 1.450 |  |  |  |  |  |  |  | 0.05 | 100 | 0.003 |
|  | 2-11 | 0.002 | 0.800 | 0.802 |  |  |  |  |  |  |  | 0.05 | 100 | 0.003 |
|  | 2-12 | 0.030 |  | 0.030 | 0.50 |  |  |  |  |  |  | 0.15 | 100 | 0.001 |
|  | 2-13 | 0.030 |  | 0.030 |  |  |  | 0.50 |  |  |  | 0.05 | 100 | — |
|  | 2-14 | 0.030 |  | 0.030 |  |  |  | 1.20 |  |  |  | 0.1 | 100 | 0.01 |
|  | 2-15 | 0.030 |  | 0.030 |  |  | 0.50 |  |  |  |  | 0.05 | 100 | 0.01 |
|  | 2-16 | 0.030 |  | 0.030 |  |  | 1.20 |  |  |  |  | 0.1 | 100 | 0.01 |
|  | 2-17 | 0.030 |  | 0.030 |  | 0.50 |  |  |  |  |  | 0.015 | 96 | 0.0005 |
|  | 2-18 | 0.030 |  | 0.030 |  | 1.20 |  |  |  |  |  | 0.1 | 100 | 0.01 |
|  | 2-19 |  | 0.030 | 0.030 | 0.80 |  |  |  |  |  |  | 0.15 | 100 | 0.01 |
|  | 2-20 |  | 0.030 | 0.030 | 1.20 |  |  |  |  |  |  | 0.05 | 100 | 0.003 |

|  |  | Crystal structure |  | Mechanical characteristics |  |  | Wire quality |  |  |  |  |  |
|---|---|---|---|---|---|---|---|---|---|---|---|---|
|  |  | <100> Proportion of wire C section (%) | Average crystal grain size (μm) | Ultimate strength ① (mN/μm²) | 0.2% Offset yield strength ② (mN/μm²) | Strength ratio ①/② | Wedge bondability | HTS | FAB shape | HAST | Crushed shape | Leaning |
|  | No. |  |  |  |  |  |  |  |  |  |  |  |
| Working Example | 2-1 | 71 | 1.2 | 0.23 | 0.17 | 1.35 | ◎ | △ | ○ | ○ | ○ | ◎ |
|  | 2-2 | 70 | 0.9 | 0.25 | 0.18 | 1.39 | ◎ | △ | ◎ | ◎ | ○ | ◎ |
|  | 2-3 | 71 | 1.0 | 0.30 | 0.23 | 1.30 | ◎ | △ | ◎ | ◎ | ○ | ◎ |
|  | 2-4 | 74 | 1.1 | 0.31 | 0.23 | 1.35 | ◎ | △ | ◎ | △ | ○ | ◎ |
|  | 2-5 | 62 | 1.1 | 0.32 | 0.25 | 1.28 | ◎ | △ | △ | ○ | ○ | ◎ |
|  | 2-6 | 74 | 1.3 | 0.34 | 0.26 | 1.31 | ◎ | △ | ◎ | ◎ | ○ | ◎ |
|  | 2-7 | 64 | 1.0 | 0.35 | 0.30 | 1.17 | ◎ | △ | ◎ | ◎ | ○ | ◎ |
|  | 2-8 | 50 | 1.2 | 0.34 | 0.22 | 1.55 | ◎ | △ | ◎ | △ | ○ | ◎ |
|  | 2-9 | 96 | 0.9 | 0.21 | 0.19 | 1.11 | ◎ | △ | ◎ | ◎ | ○ | ◎ |
|  | 2-10 | 79 | 1.0 | 0.22 | 0.16 | 1.38 | ◎ | △ | ◎ | ◎ | ○ | ◎ |
|  | 2-11 | 69 | 1.0 | 0.23 | 0.19 | 1.21 | ◎ | △ | ◎ | ◎ | ○ | ◎ |
|  | 2-12 | 53 | 1.1 | 0.30 | 0.19 | 1.58 | ◎ | ○ | ◎ | ○ | ○ | ◎ |
|  | 2-13 | 70 | 1.2 | 0.28 | 0.21 | 1.33 | ◎ | ○ | ◎ | ○ | ○ | ◎ |
|  | 2-14 | 68 | 1.0 | 0.29 | 0.25 | 1.16 | ◎ | ◎ | ◎ | ○ | ○ | ◎ |
|  | 2-15 | 69 | 1.1 | 0.32 | 0.26 | 1.23 | ◎ | ○ | ◎ | ○ | ○ | ◎ |
|  | 2-16 | 75 | 1.3 | 0.33 | 0.25 | 1.32 | ◎ | ◎ | ◎ | ○ | ○ | ◎ |
|  | 2-17 | 63 | 1.2 | 0.34 | 0.28 | 1.21 | ◎ | ○ | ◎ | ○ | ○ | ◎ |
|  | 2-18 | 73 | 1.0 | 0.31 | 0.23 | 1.35 | ◎ | ◎ | ◎ | ○ | ○ | ◎ |
|  | 2-19 | 63 | 1.0 | 0.34 | 0.29 | 1.17 | ◎ | ○ | ◎ | ○ | ○ | ◎ |
|  | 2-20 | 51 | 1.0 | 0.21 | 0.14 | 1.50 | ◎ | ◎ | ◎ | ○ | ○ | ◎ |

TABLE 6

| | | Additive element | | | | | | | | | Coating layer | | |
|---|---|---|---|---|---|---|---|---|---|---|---|---|---|
| | | $M_B$ | | | $M_A$ | | | other | | | | Pd maximum | Thickness of |
| | No. | Ga (% by mass) | Ge | $M_B$ in total | Ni | Pd (% by mass) | Pt | Ir | B | P (ppm by mass) | Mg | Thickness (μm) | concentration (at %) | alloy skin layer (μm) |
| Working Example | 2-21 | | 0.030 | 0.030 | | | | 1.20 | | | | 0.15 | 100 | 0.001 |
| | 2-22 | | 0.030 | 0.030 | | | 0.80 | | | | | 0.15 | 100 | 0.08 |
| | 2-23 | | 0.030 | 0.030 | | | | 1.20 | | | | 0.15 | 100 | 0.001 |
| | 2-24 | | 0.030 | 0.030 | | 0.80 | | | | | | 0.015 | 97 | 0.003 |
| | 2-25 | | 0.030 | 0.030 | | 1.20 | | | | | | 0.1 | 100 | 0.003 |
| | 2-26 | 0.500 | | 0.500 | 0.90 | | | | 30 | | | 0.05 | 100 | 0.003 |
| | 2-27 | 0.500 | | 0.500 | | | | 0.90 | 30 | | | 0.05 | 100 | — |
| | 2-28 | 0.500 | | 0.500 | 0.90 | | | | | 50 | | 0.05 | 100 | 0.003 |
| | 2-29 | 0.500 | | 0.500 | | | | 0.90 | | 50 | | 0.15 | 100 | 0.01 |
| | 2-30 | 0.500 | | 0.500 | 0.90 | | | | | | 10 | 0.15 | 100 | 0.001 |
| | 2-31 | 0.500 | | 0.500 | | | | 0.90 | | | 10 | 0.15 | 100 | 0.01 |
| | 2-32 | 0.800 | 0.500 | 1.300 | 0.50 | | | | 15 | | | 0.015 | 99 | 0.003 |
| | 2-33 | 0.080 | 1.200 | 1.280 | | | | 0.50 | 15 | | | 0.15 | 100 | 0.01 |
| | 2-34 | 0.300 | 0.500 | 0.800 | | | | 0.50 | | 100 | | 0.015 | 96 | 0.003 |
| | 2-35 | 0.080 | 0.040 | 0.120 | 0.50 | | | | | | 30 | 0.015 | 98 | 0.001 |
| | 2-36 | 1.000 | 0.100 | 1.100 | | | | 0.50 | | | 30 | 0.15 | 100 | 0.05 |
| | 2-37 | 0.050 | | | | | | | | | | 0.015 | 98 | — |
| | 2-38 | | 0.050 | | | | | | | | | 0.015 | 96 | — |
| | 2-39 | 1.000 | | | | | | | | | | 0.1 | 100 | — |
| | 2-40 | | 1.000 | | | | | | | | | 0.1 | 100 | — |

| | | Crystal structure | | Mechanical characteristics | | | | | | | | |
|---|---|---|---|---|---|---|---|---|---|---|---|---|
| | | <100> Proportion of wire C section (%) | Average crystal grain size (μm) | Ultimate strength ① (mN/μm²) | 0.2% Offset yield strength ② (mN/μm²) | Strength ratio ①/② — | | Wire quality | | | | |
| | No. | | | | | | Wedge bondability | HTS | FAB shape | HAST | Crushed shape | Leaning |
| Working Example | 2-21 | 84 | 0.9 | 0.29 | 0.20 | 1.45 | ◎ | ◎ | ◎ | ○ | ○ | ◎ |
| | 2-22 | 73 | 1.0 | 0.30 | 0.23 | 1.30 | ◎ | ○ | Δ | ○ | ○ | ◎ |
| | 2-23 | 50 | 1.1 | 0.28 | 0.18 | 1.56 | ◎ | ◎ | ◎ | ○ | ○ | ◎ |
| | 2-24 | 87 | 1.3 | 0.34 | 0.23 | 1.48 | ◎ | ○ | ◎ | ○ | ○ | ◎ |
| | 2-25 | 76 | 1.1 | 0.30 | 0.22 | 1.36 | ◎ | ◎ | ◎ | ○ | ○ | ◎ |
| | 2-26 | 66 | 0.9 | 0.26 | 0.21 | 1.24 | ◎ | ○ | ◎ | ◎ | ◎ | ◎ |
| | 2-27 | 65 | 1.2 | 0.29 | 0.24 | 1.21 | ◎ | ○ | ◎ | ◎ | ◎ | ◎ |
| | 2-28 | 92 | 1.2 | 0.32 | 0.29 | 1.10 | ◎ | ○ | ◎ | ◎ | ◎ | ◎ |
| | 2-29 | 72 | 1.2 | 0.33 | 0.25 | 1.32 | ◎ | ○ | ◎ | ◎ | ◎ | ◎ |
| | 2-30 | 54 | 1.1 | 0.31 | 0.2 | 1.55 | ◎ | ○ | ◎ | ◎ | ◎ | ◎ |
| | 2-31 | 81 | 1.0 | 0.25 | 0.17 | 1.47 | ◎ | ○ | ◎ | ◎ | ◎ | ◎ |
| | 2-32 | 73 | 1.2 | 0.33 | 0.25 | 1.32 | ◎ | ○ | ○ | ◎ | ◎ | ◎ |
| | 2-33 | 76 | 1.3 | 0.29 | 0.22 | 1.32 | ◎ | ○ | ◎ | ◎ | ◎ | ◎ |
| | 2-34 | 67 | 1.0 | 0.23 | 0.2 | 1.15 | ◎ | ○ | ○ | ◎ | ◎ | ◎ |
| | 2-35 | 91 | 1.1 | 0.33 | 0.3 | 1.10 | ◎ | ○ | ○ | ◎ | ◎ | ◎ |
| | 2-36 | 67 | 1.2 | 0.29 | 0.25 | 1.16 | ◎ | ○ | ◎ | ◎ | ◎ | ◎ |
| | 2-37 | 57 | 1.1 | 0.29 | 0.19 | 1.53 | ◎ | Δ | ○ | ◎ | ○ | ◎ |
| | 2-38 | 98 | 1.0 | 0.26 | 0.23 | 1.13 | ◎ | Δ | ○ | ◎ | ○ | ◎ |
| | 2-39 | 75 | 1.0 | 0.35 | 0.26 | 1.35 | ◎ | Δ | ◎ | ◎ | ○ | ◎ |
| | 2-40 | 69 | 1.2 | 0.21 | 0.18 | 1.17 | ◎ | Δ | ◎ | ◎ | ○ | ◎ |

(Method of Evaluation)

A crystal structure was evaluated on a surface of wire as an observation surface. Electron backscattered diffraction (EBSD) method was used as a method of evaluation. The EBSD method is characterized in that it can observe crystal orientations on an observation surface and can graphically show an angle difference of the crystal orientations between adjacent measurement points. Further, the EBSD method can relatively easily observe the crystal orientations with high accuracy even for a thin wire like the bonding wire.

Care should be taken when performing EBSD with a curved surface like the wire surface as an observation subject. When a region with a large curvature is measured, measurement with high accuracy is difficult. However, a bonding wire to be measured is fixed to a line on a plane, and a flat part near the center of the bonding wire is measured, whereby measurement with high accuracy can be performed. Specifically, the following measurement region will work well. The size in the circumferential direction is 50% or less of the wire diameter with the center in the wire longitudinal direction as an axis, whereas the size in the wire longitudinal direction is 100 μm or less. Preferably, the size in the circumferential direction is 40% or less of the wire diameter, whereas the size in the wire longitudinal direction is 40 μm or less, whereby measurement efficiency can be improved by reducing a measurement time. In order to further improve accuracy, it is desirable that three or more points be measured to obtain average information with variations taken into account. The measurement sites may be apart from each other by 1 mm or more so as not to be close to each other.

As for the orientation proportion of the crystal orientation <100> angled at 15 degrees or less to the wire longitudinal direction among the crystal orientations in the wire longitudinal direction in the cross-section of the core material in the direction perpendicular to the wire axis of the bonding wire and the average crystal grain size (μm) in the cross-section of the core material in the direction perpendicular to the wire axis, they were obtained by the same method as Working Examples 1 to 59. As for 0.2% offset yield strength and ultimate strength, they were evaluated by the same method as Working Examples 1 to 59 and a strength ratio was calculated by the above-mentioned equation (1).

The bonding reliability of the ball bonded part in a high-temperature and high humidity environment or a high-temperature environment was determined by manufacturing a sample for bonding reliability evaluation, performing HAST and HTS evaluation, and evaluating the bonding longevity of the ball bonded part in each test. The sample for bonding reliability evaluation was manufactured by performing ball bonding onto an electrode, which has been formed by forming an alloy of Al-1.0% Si-0.5% Cu as a film with a thickness of 0.8 μm on a Si substrate on a general metallic frame, using a commercially available wire bonder and sealing it with a commercially available epoxy resin. A ball was formed while flowing an $N_2$ 5% $H_2$ gas at a flow rate of 0.4 to 0.6 L/min, and its size was within the range of a diameter of 33 to 34 μm.

For the HAST evaluation, the manufactured sample for bonding reliability evaluation was exposed to a high-temperature and high-humidity environment with a temperature of 130° C. and a relative humidity of 85% using an unsaturated type pressure cooker tester and was biased with 7 V. A shear test on the ball bonded part was performed every 48 hours, and a time until a value of shear strength became half of the initial shear strength was determined to be the bonding longevity of the ball bonded part. The shear test after the high-temperature and high-humidity test was performed after removing the resin by acid treatment and exposing the ball bonded part.

A tester manufactured by DAGE was used for a shear tester for the HAST evaluation. An average value of measurement values of 10 ball bonded parts randomly selected was used for the value of the shear strength. In the above evaluation, the bonding longevity being less than 96 hours was determined to be practically problematic to be marked with a symbol of "cross," being 96 hours or more and less than 144 hours was determined to be practicable but somewhat problematic to be marked with a symbol of "triangle," being 144 hours or more and less than 288 hours was determined to be practically no problem to be marked with a symbol of "circle," and being 288 hours or more was determined to be excellent to be marked with a symbol of "double circle" in the column "HAST" in Tables 5 and 6.

For the HTS evaluation, the manufactured sample for bonding reliability evaluation was exposed to a high-temperature environment with a temperature of 200° C. using a high-temperature thermostatic device. A shear test on the ball bonded part was performed every 500 hours, and a time until a value of shear strength became half of the initial shear strength was determined to be the bonding longevity of the ball bonded part. The shear test after the high-temperature and high-humidity test was performed after removing the resin by acid treatment and exposing the ball bonded part.

A tester manufactured by DAGE was used for a shear tester for the HTS evaluation. An average value of measurement values of 10 ball bonded parts randomly selected was used for the value of the shear strength. In the above evaluation, the bonding longevity being 500 hours or more and less than 1,000 hours was determined to be practicable but be desired to be improved to be marked with a symbol of "triangle," being 1,000 hours or more and less than 3,000 hours was determined to be practically no problem to be marked with a symbol of "circle," and being 3,000 hours or more was determined to be especially excellent to be marked with a symbol of "double circle."

For the evaluation of ball formability (FAB shape), a ball before performing bonding was collected and observed, and the presence or absence of voids on the ball surface and the presence or absence of deformation of the ball, which is primarily a perfect sphere, were determined. The occurrence of any of the above was determined to be faulty. The formation of the ball was performed while blowing an $N_2$ gas at a flow rate of 0.5 L/min in order to reduce oxidation in a melting process. The size of the ball was 34 μm. For one condition, 50 balls were observed. A SEM was used for the observation. In the evaluation of the ball formability, a case in which five or more failures occurred was determined to be problematic to be marked with a symbol of "cross," a case of three or four failures was determined to be practicable but somewhat problematic to be marked with a symbol of "triangle," a case of one or two failures was determined to be no problem to be marked with a symbol of "circle," and a case in which no failure occurred was determined to be excellent to be marked with Aa symbol of "double circle" in the column "FAB shape" in Tables 5 and 6.

The evaluation of wedge bondability on the wire bonded part was determined by performing 1,000 pieces of bonding on leads of a lead frame and by the occurrence frequency of peeling of the bonded part. An Fe-42 at % Ni alloy lead frame plated with 1 to 3 μm Ag was used for the lead frame. In this evaluation, assuming bonding conditions more rigorous than normal, a stage temperature was set to 150° C., which was lower than a general set temperature range. In the evaluation, a case in which 11 or more failures occurred was determined to be problematic to be marked with a symbol of "cross," a case of 6 to 10 failures was determined to be practicable but somewhat problematic to be marked with a symbol of "triangle," a case of 1 to 5 failures was determined to be no problem to be marked with a symbol of "circle," and a case in which no failure occurred was determined to be excellent to be marked with a symbol of "double circle" in the column "wedge bondability" in Tables 5 and 6.

The evaluation of a crushed shape of the ball bonded part was determined by observing the ball bonded part from immediately above after bonding and evaluating by its circularity. For a bonding counterpart, an electrode in which an Al-0.5% Cu alloy was formed as a film with a thickness of 1.0 μm on a Si substrate was used. The observation was performed using an optical microscope, and 200 sites were observed for one condition. Being elliptic with large deviation from a perfect circle and being anisotropic in deformation were determined to be faulty in the crushed shape of the ball bonded part. In the above evaluation, a case in which six or more failures occurred was determined to be problematic to be marked with a symbol of "cross," a case of four or five failures was determined to be practicable but somewhat problematic to be marked with a symbol of "triangle," being one to three was determined to be no problem to be marked with a symbol of "circle," and a case in which a favorable perfect circle was obtained for all was determined to be especially excellent to be marked with a symbol of "double circle" in the column "crushed shape" in Tables 5 and 6.

[Leaning]

To a lead frame for evaluation, 100 pieces of bonding were performed with a loop length of 5 mm and a loop height of 0.5 mm. As a method of evaluation, a wire upright part was observed from a chip horizontal direction, and evaluation was performed based on spacing when spacing between a perpendicular line passing through the center of the ball bonded part and the wire upright part was maximized (leaning spacing). If the leaning spacing was smaller than the wire diameter, leaning was determined to be favorable, whereas if the leaning spacing was larger, the upright part leaned, and the leaning was determined to be faulty. One hundred bonded wires were observed with an optical microscope, and the number of leaning failures was counted. A case in which seven or more failures occurred was determined to be problematic to be marked with a symbol of "cross," a case of four to six failures was determined to be practicable but somewhat problematic to be marked with a symbol of "triangle," a case of one to three failures was determined to be no problem to be marked with a symbol of "circle," and a case in which no failure occurred was determined to be excellent to be marked with a symbol of "double circle" in the column "leaning" in Tables 5 and 6.

(Evaluation Results)

As shown in Tables 5 and 6, the bonding wires of Working Examples 2-1 through 2-40 each include the Cu alloy core material and the Pd coating layer formed on the surface of the Cu alloy core material, and the bonding wire contains one or more elements selected from Ga and Ge and a concentration of the elements in total is 0.011 to 1.5% by mass relative to the entire wire. It has been revealed that with this configuration the bonding wires of Working Examples 2-1 through 2-40 can obtain the reliability of the ball bonded part in the HAST test in the high-temperature and high-humidity environment with a temperature of 130° C. and a relative humidity of 85%.

It has been also revealed that the bonding wires of Working Examples 2-1 through 2-40 can obtain excellent wedge bondability since the strength ratio thereof was 1.1 to 1.6.

In the working examples in which the bonding wires further contain at least one element selected from Ni, Ir, Pt and Pd, it has been revealed that the high-temperature reliability of the ball bonded part in the HTS evaluation is further favorable.

In the working examples in which the bonding wires further contain at least one element selected from B, P and Mg, the crushed shape of the ball bonded part was favorable when a concentration of each of the elements was 1 to 200 ppm by mass relative to the entire wire.

Working Examples 3-1 to 3-56

(Sample)

First, there will be described a method for manufacturing a sample. For Cu as a raw material of a core material, Cu with a purity of 99.99% by mass or more and containing inevitable impurities as the remainder was used. For As, Te, Sn, Sb, Bi, Se, Ni, Zn, Rh, In, Ir, Pt, Ga, Ge, Pd, B, P, Mg, Ca and La, the ones with a purity of 99% by mass or more and containing inevitable impurities as the remainder were used. As, Te, Sn, Sb, Bi, Se, Ni, Zn, Rh, In, Ir, Pt, Ga, Ge, Pd, B, P, Mg, Ca and La as additive elements to the core material are mixed so that the wire or the core material will have a desired composition. Regarding the addition of As, Te, Sn, Sb, Bi, Se, Ni, Zn, Rh, In, Ir, Pt, Ga, Ge, Pd, B, P, Mg, Ca and La, they can be mixed singly. Alternatively, they may be mixed so as to be a desired amount using a Cu master alloy containing the additive elements manufactured in advance if the element has a high melting point as a single body or if the element is added in an infinitesimal amount.

The Cu alloy for the core material was manufactured by charging the raw materials into a carbon crucible worked into a cylindrical shape with a diameter of 3 to 6 mm, heating and melting the raw materials at 1,090 to 1,300° C. in vacuum or in an inert atmosphere such as an $N_2$ or Ar gas using a high-frequency furnace, and performing furnace cooling. The obtained alloy with a diameter of 3 to 6 mm was drawn to manufacture a wire with a diameter of 0.9 to 1.2 mm. Thereafter, a wire with a diameter of 300 to 600 μm was manufactured by successively performing wire drawing and the like using a die. A commercially available lubricant was used for the wire drawing, and a wire drawing speed was 20 to 150 m/min. In order to remove an oxide film on a surface of wire, a pickling treatment with hydrochloric acid was performed, and a Pd coating layer was formed by 1 to 15 μm so as to cover the entire surface of the Cu alloy as the core material. Furthermore, for some wires, an alloy skin layer containing Au and Pd was formed by 0.05 to 1.5 μm on the Pd coating layer. For the formation of the Pd coating layer and the alloy skin layer containing Au and Pd, electroplating was used. A commercially available semiconductor plating solution was used for a plating solution. Heat treatment at 200 to 500° C. and wire drawing were then repeatedly carried out to perform working to a diameter of 20 μm. After working, heat treatment was performed while flowing an $N_2$ or Ar gas so that breaking elongation will finally be about 5 to 15%. A method of heat treatment was performed while successively sweeping the wire and was carried out while flowing an $N_2$ or Ar gas. A wire feeding speed was 20 to 200 m/min, a heat treatment temperature was 200 to 600° C., and a heat treatment time was 0.2 to 1.0 second.

For a concentration analysis of the Pd coating layer and the alloy skin layer containing Au and Pd, an Auger electron spectrometry was performed while trimming the bonding wire from its surface in the depth direction by sputtering or the like. From an obtained concentration profile in the depth direction, there were determined a thickness of the Pd coating layer, a thickness of the alloy skin layer containing Au and Pd and a maximum concentration of Pd.

Concerning Working Examples 3-1 to 3-50, an element selected from As, Te, Sn, Sb, Bi and Se is contained in the core material. Concerning Working Examples 3-51 to 3-56, Cu with a purity of 99.99% by mass or more was used for the core material and As, Te, Sn, Sb, Bi or Se was contained by depositing them onto the wire surface (coating layer) by electroplating during a manufacturing process of wire.

Concerning Working Examples 3-34 through 3-44, Cu is caused to be present at an outermost surface of the bonding wire. In this regard, a column of "Cu concentration at wire surface" is provided in Table 8, and results obtained by measuring a surface of the bonding wire by an Auger electron spectroscopic apparatus were entered therein. By selecting a temperature and time for heat treatment of the bonding wire, Cu was caused to be present at an outermost surface at a certain concentration. Concerning Working Examples 3-1 through 3-33 and 3-45 through 3-56, heat treatment conditions that caused Cu not to be present at an outermost surface were applied, and therefore Cu was not detected by the Auger electron spectroscopic apparatus.

The configurations of the samples manufactured according to the above procedure are listed in Tables 7 and 8.

TABLE 7

| | | Additive element | | | | | | | | | | | | | | | |
|---|---|---|---|---|---|---|---|---|---|---|---|---|---|---|---|---|---|
| | | Mc | | | | | | | $M_A$ | | | | | | Ms | | Other |
| | | As | Te | Sn | Sb | Bi | Se | $M_e$ | Ni Pd Pt Zn Rh In | | | | | | Ir Ga Ge | | B P Mg Ca La |
| | No. | (ppm by mass) | | | | | | in total | (% by mass) (Amount in core material for Pd (% by mass)) | | | | | | | | (ppm by mass) |
| Working Example | 3-1 | 0.4 | | | | | | 0.4 | | | | | | | | | |
| | 3-2 | 1.2 | | | | | | 1.2 | | | | | | | | | |
| | 3-3 | 12 | | | | | | 12 | | | | | | | | | |
| | 3-4 | 75 | | | | | | 75 | | | | | | | | | |
| | 3-5 | | 0.1 | | | | | 0.1 | | | | | | | | | |
| | 3-6 | | 1.2 | | | | | 1.2 | | | | | | | | | |
| | 3-7 | | 15 | | | | | 15 | | | | | | | | | |
| | 3-8 | | 98 | | | | | 98 | | | | | | | | | |
| | 3-9 | | | 0.2 | | | | 0.2 | | | | | | | | | |
| | 3-10 | | | 1.3 | | | | 1.3 | | | | | | | | | |
| | 3-11 | | | 10 | | | | 10 | | | | | | | | | |
| | 3-12 | | | | 0.1 | | | 0.1 | | | | | | | | | |
| | 3-13 | | | | 1.2 | | | 1.2 | | | | | | | | | |
| | 3-14 | | | | 9.8 | | | 98 | | | | | | | | | |
| | 3-15 | | | | | 0.3 | | 0.3 | | | | | | | | | |
| | 3-16 | | | | | 1 | | 1 | | | | | | | | | |
| | 3-17 | | | | | | 0.1 | 0.1 | | | | | | | | | |
| | 3-18 | | | | | | 1.2 | 1.2 | | | | | | | | | |
| | 3-19 | | | | | | 4.9 | 4.9 | | | | | | | | | |
| | 3-20 | | | | | | 99 | 99 | | | | | | | | | |
| | 3-21 | 0.1 | | | | | | 0.1 | | | | | 0.05 | | | | |
| | 3-22 | 4.1 | | | | | | 4.1 | 1.2 | | | | | | | | 100 |
| | 3-23 | 8.1 | | | | | | 8.1 | | | | | | | 0.7 | | 100 |
| | 3-24 | 12 | | | | | | 12 | | | | | | | 0.7 | | 50 |
| | 3-25 | 18 | | | | | | 18 | 0.7 | | | | | | | | 50 |

| | | Coating layer | | | Crystal structure | | Mechanical characteristics | |
|---|---|---|---|---|---|---|---|---|
| | | | Pd maximum | Thickness of | <100> Proportion of | Average crystal | Ultimate | 0.2% offset yield |
| | No. | Thickness (μm) | concentration (at %) | alloy skin layer (μm) | wire C section (%) | grain size (μm) | strength ① (mN/μm²) | strength ② (mN/μm²) |
| Working Example | 3-1 | 0.1 | 100 | 0.01 | 94 | 0.9 | 0.33 | 0.22 |
| | 3-2 | 0.15 | 100 | 0.05 | 74 | 1.0 | 0.29 | 0.22 |
| | 3-3 | 0.01 | 100 | — | 73 | 1.1 | 0.25 | 0.19 |
| | 3-4 | 0.05 | 100 | 0.001 | 75 | 1.2 | 0.22 | 0.17 |
| | 3-5 | 0.015 | 98 | 0.0005 | 77 | 1.3 | 0.32 | 0.24 |
| | 3-6 | 0.1 | 100 | 0.001 | 65 | 1.0 | 0.28 | 0.23 |
| | 3-7 | 0.15 | 100 | 0.003 | 77 | 0.9 | 0.33 | 0.25 |
| | 3-8 | 0.01 | 100 | 0.01 | 84 | 1.2 | 0.31 | 0.21 |
| | 3-9 | 0.015 | 97 | 0.05 | 98 | 1.2 | 0.32 | 0.21 |
| | 3-10 | 0.05 | 100 | — | 54 | 1.1 | 0.29 | 0.26 |
| | 3-11 | 0.1 | 100 | 0.0005 | 50 | 1.2 | 0.23 | 0.21 |
| | 3-12 | 0.15 | 100 | 0.001 | 66 | 1.0 | 0.19 | 0.16 |
| | 3-13 | 0.015 | 95 | 0.003 | 87 | 1.1 | 0.30 | 0.21 |
| | 3-14 | 0.05 | 100 | 0.01 | 93 | 0.9 | 0.35 | 0.22 |
| | 3-15 | 0.1 | 100 | 0.05 | 54 | 1.1 | 0.20 | 0.18 |
| | 3-16 | 0.15 | 100 | 0.001 | 78 | 1.2 | 0.30 | 0.23 |
| | 3-17 | 0.015 | 99 | 0.003 | 65 | 1.2 | 0.25 | 0.20 |
| | 3-18 | 0.05 | 100 | 0.01 | 52 | 1.3 | 0.21 | 0.19 |
| | 3-19 | 0.1 | 100 | 0.05 | 60 | 1.1 | 0.26 | 0.22 |
| | 3-20 | 0.15 | 100 | — | 90 | 1.2 | 0.30 | 0.19 |
| | 3-21 | 0.015 | 97 | — | 55 | 1.3 | 0.19 | 0.17 |
| | 3-22 | 0.1 | 100 | 0.001 | 90 | 0.9 | 0.32 | 0.21 |
| | 3-23 | 0.1 | 100 | 0.003 | 68 | 0.9 | 0.25 | 0.20 |
| | 3-24 | 0.05 | 100 | 0.05 | 60 | 1.0 | 0.24 | 0.20 |
| | 3-25 | 0.15 | 100 | 0.003 | 85 | 1.0 | 0.30 | 0.21 |

| | | Mechanical characteristics Strength ratio | Wire quality | | | | |
|---|---|---|---|---|---|---|---|
| | No. | ①/② — | Wedge bondability | HTS | FAB shape | HAST | Crushed shape | Leaning |
| Working Example | 3-1 | 1.50 | ◎ | Δ | ◎ | ○ | ○ | ◎ |
| | 3-2 | 1.32 | ◎ | Δ | ○ | ◎ | ○ | ○ |
| | 3-3 | 1.32 | ◎ | Δ | Δ | ◎ | ○ | ◎ |
| | 3-4 | 1.29 | ◎ | Δ | ◎ | ◎ | ○ | ◎ |

TABLE 7-continued

| No. | | | | | | | | |
|---|---|---|---|---|---|---|---|---|
| 3-5 | 1.33 | ◎ | Δ | ○ | ○ | ○ | ○ | ◎ |
| 3-6 | 1.22 | ◎ | Δ | ◎ | ◎ | ◎ | ○ | ○ |
| 3-7 | 1.32 | ◎ | Δ | ○ | ◎ | ◎ | ○ | ◎ |
| 3-8 | 1.48 | ◎ | Δ | Δ | ◎ | ◎ | ○ | ◎ |
| 3-9 | 1.52 | ◎ | Δ | ○ | ○ | ○ | ○ | ○ |
| 3-10 | 1.12 | ◎ | Δ | ◎ | ◎ | ◎ | ○ | ◎ |
| 3-11 | 1.10 | ◎ | Δ | ◎ | ◎ | ◎ | ○ | ◎ |
| 3-12 | 1.19 | ◎ | Δ | ○ | ○ | ○ | ○ | ○ |
| 3-13 | 1.43 | ◎ | Δ | ○ | ◎ | ◎ | ○ | ◎ |
| 3-14 | 1.59 | ◎ | Δ | ◎ | ◎ | ◎ | ○ | ◎ |
| 3-15 | 1.11 | ◎ | Δ | ○ | ○ | ○ | ○ | ○ |
| 3-16 | 1.30 | ◎ | Δ | ○ | ◎ | ◎ | ○ | ◎ |
| 3-17 | 1.25 | ◎ | Δ | ○ | ○ | ○ | ○ | ◎ |
| 3-18 | 1.11 | ◎ | Δ | ◎ | ◎ | ◎ | ○ | ○ |
| 3-19 | 1.18 | ◎ | Δ | ◎ | ◎ | ◎ | ○ | ◎ |
| 3-20 | 1.58 | ◎ | Δ | ○ | ◎ | ◎ | ○ | ◎ |
| 3-21 | 1.12 | ◎ | ○ | ○ | ◎ | ◎ | ○ | ◎ |
| 3-22 | 1.52 | ◎ | ◎ | ◎ | ◎ | ◎ | ◎ | ◎ |
| 3-23 | 1.25 | ◎ | ◎ | ◎ | ◎ | ◎ | ◎ | ◎ |
| 3-24 | 1.20 | ◎ | ◎ | ◎ | ◎ | ◎ | ◎ | ◎ |
| 3-25 | 1.43 | ◎ | ◎ | ○ | ◎ | ◎ | ◎ | ◎ |

TABLE 8

| | | Additive element | | | | | | | | | | | | | | | |
|---|---|---|---|---|---|---|---|---|---|---|---|---|---|---|---|---|---|
| | | Mc | | | | | | $M_A$ | | | | | | Ms | | Other | |
| | No. | As | Te | Sn | Sb | Bi | Se | $M_e$ in total | Ni | Pd | Pt | Zn | Rh | In | Ir | Ga | Ge | B | P | Mg Ca | La |
| | | (ppm by mass) | | | | | | | (% by mass) (Amount in core material for Pd (% by mass)) | | | | | | | | | (ppm by mass) | | | |
| Working Example | 3-26 | 52 | | | | | | 52 | 0.05 | | | | | | | | | | | | 50 |
| | 3-27 | 99 | | | | | | 99 | | 0.1 | | | | | | | | | | | |
| | 3-28 | 0.2 | | | | | | 0.2 | 0.1 | | | | | 0.05 | | | | | | | |
| | 3-29 | 2.5 | | | | | | 2.5 | 1.1 | | | | | | | 0.05 | | 100 | | | |
| | 3-30 | 5.2 | | | | | | 5.2 | 1.1 | | | | | | 0.1 | | | 100 | | | |
| | 3-31 | 21 | | | | | | 21 | 0.7 | | | | 0.1 | | | | | 50 | | | |
| | 3-32 | 41 | | | | | | 41 | | 1.1 | | | | | | | 0.05 | | 1 | | |
| | 3-33 | 98 | | | | | | 98 | 0.1 | 0.1 | | | | | | | | | | | |
| | 3-34 | 22 | | | | | | 22 | | | | | | | | | | | | | |
| | 3-35 | 16 | | | | | | 16 | 1.1 | | | | | | 0.1 | | | | | | |
| | 3-36 | | | 4.1 | | | | 4.1 | | | | | | | | | | | | | |
| | 3-37 | | | | 5.8 | | | 5.8 | 0.7 | 0.7 | | | | | | | | | | | |
| | 3-38 | | | | | 0.7 | | 0.7 | | | | | | | | | | | | | |
| | 3-39 | | | | | | 4.8 | 4.8 | | | | | | 1.1 | 1.1 | | | | | | |
| | 3-40 | 2.5 | | | | | | 2.5 | | | 0.7 | | | | | 0.1 | | | | | |
| | 3-41 | | 1.8 | | | | | 1.8 | | | | | 0.1 | | | | 0.05 | | | | |
| | 3-42 | | | 0.5 | | | | 0.5 | 1.1 | | | | | | | | 0.05 | | | | |
| | 3-43 | | | | 0.2 | | | 0.2 | | | | | | 0.05 | | | | 0.1 | | | |
| | 3-44 | | | | | | 20 | 20 | 0.7 | | | | | | | | 0.02 | | | | |
| | 3-45 | 1.0 | | | | | | 1 | | | | | | | | | | | | | |
| | 3-46 | | 1.5 | | | | | 1.5 | | | | | | | | | | | | | |
| | 3-47 | | | 1.2 | | | | 1.2 | | | | | | | | | | | | | |
| | 3-48 | | | | 1.0 | | | 1 | | | | | | | | | | | | | |
| | 3-49 | | | | | 0.9 | | 0.9 | | | | | | | | | | | | | |
| | 3-50 | | | | | | 1.2 | 1.2 | | | | | | | | | | | | | |
| | 3-51 | 20.0 | | | | | | 20 | | | | | | | | | | | | | |
| | 3-52 | | 14.0 | | | | | 14 | | | | | | | | | | | | | |
| | 3-53 | | | 3.2 | | | | 3.2 | | | | | | | | | | | | | |
| | 3-54 | | | | 5.2 | | | 5.2 | | | | | | | | | | | | | |
| | 3-55 | | | | | 0.5 | | 0.5 | | | | | | | | | | | | | |
| | 3-56 | | | | | | 4.5 | 4.5 | | | | | | | | | | | | | |

| | | Coating layer | | | Crystal structure | | Mechanical characteristics | | |
|---|---|---|---|---|---|---|---|---|---|
| | | | | | <100> | Average | | 0.2% Offset | |
| | No. | Thickness (μm) | Pd maximum concentration (at %) | Thickness of alloy skin layer (μm) | Proportion of wire C section (%) | crystal grain size (μm) | Ultimate strength ① (mN/μm²) | yield strength ② (mN/μm²) | Strength ratio ①/② |
| Working Example | 3-26 | 0.1 | 100 | 0.0005 | 72 | 1.2 | 0.27 | 0.21 | 1.29 |
| | 3-27 | 0.01 | 100 | 0.01 | 92 | 1.1 | 0.34 | 0.22 | 1.55 |
| | 3-28 | 0.05 | 100 | 0.0005 | 98 | 1.3 | 0.25 | 0.16 | 1.56 |
| | 3-29 | 0.1 | 100 | 0.003 | 65 | 1.1 | 0.24 | 0.20 | 1.20 |

TABLE 8-continued

| No. | | | | | | | | |
|---|---|---|---|---|---|---|---|---|
| 3-30 | 0.1 | 100 | 0.001 | 74 | 1.1 | 0.30 | 0.22 | 1.36 |
| 3-31 | 0.15 | 100 | 0.003 | 52 | 1.2 | 0.23 | 0.21 | 1.10 |
| 3-32 | 0.05 | 100 | 0.05 | 88 | 1.0 | 0.32 | 0.22 | 1.45 |
| 3-33 | 0.01 | 100 | 0.01 | 60 | 1.0 | 0.21 | 0.18 | 1.17 |
| 3-34 | 0.1 | 100 | 0.001 | 87 | 1.1 | 0.30 | 0.21 | 1.43 |
| 3-35 | 0.15 | 100 | 0.003 | 65 | 1.3 | 0.28 | 0.24 | 1.17 |
| 3-36 | 0.01 | 100 | 0.01 | 54 | 0.9 | 0.23 | 0.21 | 1.10 |
| 3-37 | 0.05 | 100 | 0.05 | 74 | 1.2 | 0.29 | 0.22 | 1.32 |
| 3-38 | 0.1 | 100 | — | 96 | 1.1 | 0.29 | 0.19 | 1.53 |
| 3-39 | 0.15 | 100 | 0.0005 | 66 | 1.0 | 0.21 | 0.17 | 1.24 |
| 3-40 | 0.01 | 100 | — | 88 | 1.0 | 0.33 | 0.23 | 1.43 |
| 3-41 | 0.05 | 100 | 0.0005 | 96 | 1.1 | 0.31 | 0.20 | 1.55 |
| 3-42 | 0.1 | 100 | 0.001 | 54 | 0.9 | 0.26 | 0.23 | 1.13 |
| 3-43 | 0.15 | 100 | 0.003 | 84 | 1.2 | 0.32 | 0.22 | 1.45 |
| 3-44 | 0.01 | 100 | 0.01 | 85 | 1.2 | 0.29 | 0.20 | 1.45 |
| 3-45 | 0.1 | 100 | — | 96 | 1.1 | 0.29 | 0.19 | 1.53 |
| 3-46 | 0.1 | 100 | — | 57 | 1.0 | 0.20 | 0.18 | 1.11 |
| 3-47 | 0.1 | 100 | — | 77 | 1.3 | 0.30 | 0.23 | 1.30 |
| 3-48 | 0.1 | 100 | — | 72 | 0.9 | 0.28 | 0.21 | 1.33 |
| 3-49 | 0.1 | 100 | — | 56 | 1.2 | 0.21 | 0.18 | 1.17 |
| 3-50 | 0.1 | 100 | — | 61 | 1.0 | 0.22 | 0.18 | 1.22 |
| 3-51 | 0.1 | 100 | 0.001 | 97 | 1.2 | 0.28 | 0.20 | 1.40 |
| 3-52 | 0.15 | 100 | 0.003 | 58 | 1.1 | 0.21 | 0.18 | 1.17 |
| 3-53 | 0.01 | 100 | 0.01 | 78 | 1.3 | 0.29 | 0.23 | 1.26 |
| 3-54 | 0.05 | 100 | 0.05 | 73 | 1.0 | 0.27 | 0.21 | 1.29 |
| 3-55 | 0.1 | 100 | — | 57 | 1.2 | 0.22 | 0.18 | 1.22 |
| 3-56 | 0.15 | 100 | 0.0005 | 62 | 1.1 | 0.22 | 0.19 | 1.16 |

| | No. | Wire quality | | | | | | Cu concentration at wire surface (at %) |
|---|---|---|---|---|---|---|---|---|
| | | Wedge bondability | HTS | FAB shape | HAST | Crushed shape | Leaning | |
| Working Example | 3-26 | ◎ | ○ | ◎ | ◎ | ◎ | ◎ | |
| | 3-27 | ◎ | ○ | Δ | ◎ | ○ | ◎ | |
| | 3-28 | ◎ | ○ | ◎ | ◎ | ○ | ◎ | |
| | 3-29 | ◎ | ○ | ◎ | ◎ | ◎ | ◎ | |
| | 3-30 | ◎ | ◎ | ◎ | ◎ | ◎ | ◎ | |
| | 3-31 | ◎ | ◎ | ○ | ◎ | ◎ | ◎ | |
| | 3-32 | ◎ | ◎ | ◎ | ◎ | ◎ | ◎ | |
| | 3-33 | ◎ | ○ | Δ | ◎ | ○ | ◎ | |
| | 3-34 | ◎◎ | Δ | ◎ | ○ | ○ | ○ | 5.4 |
| | 3-35 | ◎◎ | ◎ | ○ | ○ | ○ | ◎ | 5.2 |
| | 3-36 | ◎◎ | Δ | Δ | ○ | ○ | ◎ | 10 |
| | 3-37 | ◎◎ | ◎ | ◎ | ○ | ○ | ◎ | 11 |
| | 3-38 | ◎ | Δ | ◎ | Δ | ○ | ○ | 26 |
| | 3-39 | ◎◎ | ◎ | ○ | Δ | ○ | ◎ | 28 |
| | 3-40 | ◎◎ | ◎ | Δ | Δ | ○ | ◎ | 1.1 |
| | 3-41 | ◎◎ | ◎ | ◎ | Δ | ○ | ◎ | 1.4 |
| | 3-42 | ◎ | ◎ | ◎ | ○ | ○ | ◎ | 5.2 |
| | 3-43 | ◎ | ◎ | ○ | ○ | ○ | ◎ | 5.5 |
| | 3-44 | ◎◎ | ◎ | Δ | ○ | ○ | ◎ | 12 |
| | 3-45 | ◎ | Δ | ◎ | ◎ | ○ | ◎ | |
| | 3-46 | ◎ | Δ | ◎ | ◎ | ○ | ◎ | |
| | 3-47 | ◎ | Δ | ◎ | ◎ | ○ | ◎ | |
| | 3-48 | ◎ | Δ | ◎ | ◎ | ○ | ◎ | |
| | 3-49 | ◎ | Δ | ◎ | ◎ | ○ | ◎ | |
| | 3-50 | ◎ | Δ | ◎ | ◎ | ○ | ◎ | |
| | 3-51 | ◎ | Δ | ◎ | ◎ | ○ | ◎ | |
| | 3-52 | ◎ | Δ | ○ | ◎ | ○ | ○ | |
| | 3-53 | ◎ | Δ | Δ | ◎ | ○ | ◎ | |
| | 3-54 | ◎ | Δ | ◎ | ◎ | ○ | ◎ | |
| | 3-55 | ◎ | Δ | ◎ | ○ | ○ | ○ | |
| | 3-56 | ◎ | Δ | ○ | ◎ | ○ | ◎ | |

(Method of Evaluation)

A crystal structure was evaluated with a surface of wire as an observation surface. An electron backscattered diffraction method (EBSD) was used as a method of evaluation. The EBSD method is characterized in that it can observe crystal orientations on an observation surface and graphically shows an angle difference of the crystal orientations between adjacent measurement points. The EBSD method can relatively easily observe the crystal orientations with high accuracy, even for a thin wire like the bonding wire.

Care should be taken when performing EBSD method with a curved surface like the wire surface as a subject. When a region with a large curvature is measured, measurement with high accuracy is difficult. However, a bonding wire to be measured is fixed to a line on a plane, and a flat part near the center of the bonding wire is measured, whereby measurement with high accuracy can be performed. Specifically, the following measurement region will work well. The size in the circumferential direction is 50% or less of the wire diameter with a center in the wire longitudinal direction as an axis, and the size in the wire longitudinal direction is 100 µm or less. Preferably, the size in the circumferential direction is 40% or less of the wire diameter, and the size in the wire longitudinal direction is 40 µm or less, whereby measurement efficiency can be improved by reducing a measurement time. In order to further improve accuracy, it is desirable that three or more points are measured to obtain average information with variations taken into account. The measurement sites may be apart from each other by 1 mm or more so as not to be close to each other.

As for the orientation proportion of the crystal orientation <100> angled at 15 degrees or less to the wire longitudinal direction among the crystal orientations in the wire longitudinal direction in the cross-section of the core material in the direction perpendicular to the wire axis of the bonding wire and the average crystal grain size (µm) in the cross-section of the core material in the direction perpendicular to the wire axis, they were obtained by the same method as Working Examples 1 to 59. As for 0.2% offset yield strength and ultimate strength, they were evaluated by the same method as Working Examples 1 to 59 and a strength ratio was calculated by the above-mentioned equation (1).

The bonding reliability of the ball bonded part in a high-temperature and high humidity environment or a high-temperature environment was determined by manufacturing a sample for bonding reliability evaluation, performing HAST and HTS evaluation, and by evaluating the bonding longevity of the ball bonded part in each test. The sample for bonding reliability evaluation was manufactured by performing ball bonding onto an electrode, which has been formed by forming an alloy of Al-1.0% Si-0.5% Cu as a film with a thickness of 0.8 µm on a Si substrate on a general metallic frame, using a commercially available wire bonder and sealing it with a commercially available epoxy resin. A ball was formed while flowing an $N_2$ 5% $H_2$ gas at a flow rate of 0.4 to 0.6 L/min, and its size was a diameter of a range from 33 to 34 µm.

For the HAST evaluation, the manufactured sample for bonding reliability evaluation was exposed to a high-temperature and high-humidity environment of a temperature of 130° C. and a relative humidity of 85% using an unsaturated type pressure cooker tester and was biased with 5 V. A shear test on the ball bonded part was performed every 48 hours, and a time until a value of shear strength became half of the initial shear strength was determined to be the bonding longevity of the ball bonded part. The shear test after the high-temperature and high-humidity test was carried out after removing a resin by acid treatment and exposing the ball bonded part.

A tester manufactured by DAGE was used for a shear tester for the HAST evaluation. An average value of measurement values on 10 ball bonded parts randomly selected was used for the value of the shear strength. In the above evaluation, the bonding longevity being less than 96 hours was determined to be practically problematic to be marked with a symbol of "cross," being 96 hours or more and less than 144 hours was determined to be practicable but somewhat problematic to be marked with a symbol of "triangle," being 144 hours or more and less than 288 hours was determined to be practically no problem to be marked with a symbol of "circle," being 288 hours or more and less than 384 hours was determined to be excellent to be marked with a symbol of "double circle," and being 384 hours or more was determined to be especially excellent to be marked to with a symbol of "a pair of double circle" in the column "HAST" in Tables 7 and 8.

For the HTS evaluation, the manufactured sample for bonding reliability evaluation was exposed to a high-temperature environment of a temperature of 200° C. using a high-temperature thermostatic device. A shear test on the ball bonded part was performed every 500 hours, and a time until a value of shear strength became half of the initial shear strength was determined to be the bonding longevity of the ball bonded part. The shear test after the high-temperature and high-humidity test was performed after removing a resin by acid treatment and exposing the ball bonded part.

A tester manufactured by DAGE was used for a shear tester for the HTS evaluation. An average value of measurement values on 10 ball bonded parts randomly selected was used for the value of the shear strength. In the above evaluation, the bonding longevity being 500 or more to less than 1,000 hours was determined to be practicable but desirably to be improved to be marked with a symbol of "triangle," being 1,000 or more to less than 3,000 hours was determined to be practically no problem to be marked with a symbol of "circle," and being 3,000 hours or more was determined to be especially excellent to be marked with a symbol of "double circle" in the column "HTS" in Tables 7 and 8.

For the evaluation of ball formability (FAB shape), a ball before performing bonding was collected and observed, and the presence or absence of voids on a surface of the ball and the presence or absence of deformation of the ball, which is primarily a perfect sphere, were determined. The occurrence of any of the above was determined to be faulty. The formation of the ball was performed while an $N_2$ gas was blown at a flow rate of 0.5 L/min in order to reduce oxidation in a melting process. The size of the ball was 34 µm. For one condition, 50 balls were observed. A SEM was used for the observation. In the evaluation of the ball formability, a case where five or more failures occurred was determined to be problematic to be marked with a symbol of "cross," a case of three or four failures was determined to be practicable but somewhat problematic to be marked with a symbol of "triangle," a case of one or two failures was determined to be no problem to be marked with a symbol of "circle," and a case where no failure occurred was determined to be excellent to be marked with a symbol of "double circle" in the column "FAB shape" in Tables 7 and 8.

The evaluation of wedge bondability on the wire bonded part was determined by performing 1,000 pieces of bonding on leads of a lead frame and evaluating by the occurrence frequency of peeling of the bonded part. An Fe-42 at % Ni alloy lead frame plated with 1 to 3 µm Ag was used for the lead frame. In this evaluation, assuming more rigorous bonding conditions than normal, a stage temperature was set to be 150° C., which was lower than a generally set temperature range. In the above evaluation, a case where 11 or more failures occurred was determined to be problematic to be marked with a symbol of "cross," a case of 6 to 10 failures was determined to be practicable but somewhat problematic to be marked with a symbol of "triangle," a case of 1 to 5 failures was determined to be no problem to be marked with a symbol of "circle," and a case where no failure occurred was determined to be excellent to be marked with a symbol of "double circle" in the column "wedge bondability" in Tables 7 and 8.

The evaluation of a crushed shape of the ball bonded part was determined by observing the ball bonded part from immediately above after bonding and evaluating by its circularity. For an object to be bonded with the bonding wire, an electrode in which an Al-0.5% Cu alloy was formed as a film with a thickness of 1.0 µm on a Si substrate was used. The observation was performed using an optical microscope, and 200 sites were observed for one condition. Being elliptic with large deviation from a perfect circle and being anisotropic in deformation were determined to be faulty in the crushed shape of the ball bonded part. In the above evaluation, a case where six or more failures occurred was determined to be problematic to be marked with a symbol of "cross," a case of four or five failures was determined to be practicable but somewhat problematic to be marked with a symbol of "triangle," being one to three was determined to be no problem to be marked with a symbol of "circle," and a case where a favorable perfect circle was obtained for all was determined to be especially excellent to be marked with a symbol of "double circle" in the column "crushed shape" in Tables 7 and 8.

[Leaning]

To a lead frame for evaluation, 100 pieces of bonding were performed with a loop length of 5 mm and a loop height of 0.5 mm. As a method of evaluation, a wire upright part was observed from a chip horizontal direction, and evaluation was performed based on spacing when spacing between a perpendicular line passing through the center of the ball bonded part and the wire upright part was maximized (leaning spacing). If the leaning spacing was smaller than the wire diameter, leaning was determined to be favorable, whereas if the leaning spacing was larger, the upright part leaned, and the leaning was determined to be faulty. One hundred bonded wires were observed with an optical microscope, and the number of leaning failures was counted. A case where seven or more failures occurred was determined to be problematic to be marked with a symbol of "cross," a case of four to six failures was determined to be practicable but somewhat problematic to be marked with a symbol of "triangle," a case of one to three failures was determined to be no problem to be marked with a symbol of "circle," and a case in which no failure occurred was determined to be excellent to be marked with a symbol of "double circle" in the column "leaning" in Tables 7 and 8.

(Evaluation Results)

The bonding wires according to Working Examples 3-1 through 3-56 each include a Cu alloy core material and a Pd coating layer formed on the surface of the Cu alloy core material, and the bonding wire contains at least one or more elements selected from As, Te, Sn, Sb, Bi and Se, a concentration of the elements in total is 0.1 to 100 ppm by mass relative to the entire wire. It has been revealed that with this configuration the bonding wires according to Working Examples 3-1 through 3-50 can achieve the reliability of the ball bonded part in the HAST test in the high-temperature and high-humidity environment of a temperature of 130° C. and a relative humidity of 85%.

In the working examples further including an alloy skin layer containing Au and Pd on the Pd coating layer, it has been revealed that excellent wedge bondability can be obtained when a thickness of the alloy skin layer containing Au and Pd is 0.0005 to 0.050 µm.

In Working Examples 3-21 through 3-33, 3-35, 3-37, and 3-39 through 3-44, it has been revealed that the high-temperature reliability of the ball bonded part by the HTS evaluation is favorable because the bonding wire further contains at least one or more elements selected from Ni, Zn, Rh, In, Ir, Pt, Ga and Ge, and a concentration of each of the elements other than Pd is 0.011 to 1.2% by mass relative to the entire wire, and a concentration of Pd contained in the Cu alloy core material is 0.05 to 1.2% by mass.

In Working Examples 3-22 through 3-26 and 3-29 through 3-32, the FAB shape was favorable and the wedge bondability was favorable when the bonding wire further contains at least one or more elements selected from B, P, Mg, Ca and La, and a concentration of each of the elements is 1 to 100 ppm by mass relative to the entire wire.

In Working Examples 3-34 through 3-44, the wire contains As, Te, Sn, Sb, Bi and Se, and Cu was present at an outermost surface of the wire. With this configuration, Working Examples 3-34 through 3-44 were a symbol of "a pair of double circle" or a symbol of "double circle" in the HAST evaluation results, which revealed the effect of causing Cu to be present at an outermost surface.

The invention claimed is:

1. A bonding wire for a semiconductor device, the bonding wire comprising:
   a Cu alloy core material; and
   a Pd coating layer formed on a surface of the Cu alloy core material, wherein
   a strength ratio defined by the following Equation (1) is 1.1 or more and 1.6 or less, strength ratio=ultimate strength/0.2% offset yield strength     Equation (1), and the bonding wire meets at least one of the following conditions (i) and (ii):
   (i) the bonding wire contains one or more elements selected from Co, Rh, Jr, Ni, Pd, Pt, Au, Zn, Al, Ga, In, and Ge; and
   (ii) the bonding wire contains one or more elements selected from As, Sb, and Te, provided that:
   a concentration of As is 2.5 ppm by mass or more;
   a concentration of Sb is 5.2 ppm by mass or more; or
   a concentration of Te is 1.2 ppm by mass or more.

2. The bonding wire for a semiconductor device according to claim 1, wherein a thickness of the Pd coating layer is 0.015 µm or more and 0.150 µm or less.

3. The bonding wire for a semiconductor device according to claim 1, further comprising an alloy skin layer containing Au and Pd on the Pd coating layer.

4. The bonding wire for a semiconductor device according to claim 3, wherein a thickness of the alloy skin layer containing Au and Pd is 0.050 µm or less.

5. The bonding wire for a semiconductor device according to claim 1, wherein
   the bonding wire contains at least one element selected from Ni, Zn, Rh, In, Jr and Pt, and
   a concentration of the at least one element in total is 0.011% by mass or more and 2% by mass or less relative to the entire wire.

6. The bonding wire for a semiconductor device according to claim 1, wherein
   the bonding wire contains one or more elements selected from Ga and Ge, and
   a concentration of the elements in total is 0.011% by mass or more and 1.5% by mass
   or less relative to the entire wire.

7. The bonding wire for a semiconductor device according to claim 1, wherein
   the bonding wire contains at least one or more elements selected from As, Te, and Sb,
   a concentration of the elements in total is 0.1 ppm by mass or more and 100 ppm by mass or less relative to the entire wire, and
   Sb≤10 ppm by mass.

8. The bonding wire for a semiconductor device according to claim 1, wherein
   the bonding wire further contains at least one element selected from B, P, Mg, Ca and La, and a concentration of each of the at least one element is 1 ppm by mass or more and 200 ppm by mass or less relative to the entire wire.

9. The bonding wire for a semiconductor device according to claim 1, wherein Cu is present at an outermost surface of the bonding wire.

* * * * *